United States Patent
Park et al.

(10) Patent No.: US 9,257,462 B2
(45) Date of Patent: Feb. 9, 2016

(54) CMOS IMAGE SENSOR FOR INCREASING CONVERSION GAIN

(75) Inventors: Young Hwan Park, Namyangju-si (KR); Jung Chak Ahn, Yongin-si (KR); Sang Joo Lee, Seongnam-si (KR); Jong Eun Park, Seongnam-si (KR); Young Heub Jang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 733 days.

(21) Appl. No.: 13/530,334

(22) Filed: Jun. 22, 2012

(65) Prior Publication Data
US 2013/0015324 A1    Jan. 17, 2013

(30) Foreign Application Priority Data

Jul. 15, 2011 (KR) .................... 10-2011-0070544

(51) Int. Cl.
*H01L 27/146* (2006.01)
(52) U.S. Cl.
CPC .... *H01L 27/14603* (2013.01); *H01L 27/14641* (2013.01)

(58) Field of Classification Search
CPC .............................. H01L 27/146; H01L 27/148
USPC ................................ 250/208.1; 257/290–292
See application file for complete search history.

(56) References Cited

U.S. PATENT DOCUMENTS

| | | | |
|---|---|---|---|
| 6,838,715 B1 * | 1/2005 | Bencuya et al. | ............... 257/291 |
| 7,800,191 B2 | 9/2010 | Ohtsuki et al. | |
| 2006/0132633 A1 * | 6/2006 | Nam et al. | .................... 348/308 |
| 2010/0091167 A1 | 4/2010 | Azami | |

FOREIGN PATENT DOCUMENTS

| | | | |
|---|---|---|---|
| JP | 2007243093 A | 9/2007 | |
| JP | 2010093641 A | 4/2010 | |
| KR | 100663742 B1 | 1/2007 | |
| KR | 20070093335 A | 9/2007 | |
| KR | 20100040251 A | 4/2010 | |

* cited by examiner

*Primary Examiner* — Seung C Sohn
(74) *Attorney, Agent, or Firm* — Harness, Dickey & Pierce, P.L.C.

(57) ABSTRACT

In one embodiment, the image sensor includes a first photodiode configured to convert an optical signal into a photocharge, a sensing node configured to store the photocharge of the first photodiode, and a circuit configured to selectively output an electrical signal corresponding to the photocharge at the sensing node on an output line. The circuit is connected to at least a first conductive contact, and the output line is disposed between the sensing node and the first conductive contact.

38 Claims, 29 Drawing Sheets

CMOS IMAGE SENSOR FOR INCREASING CONVERSION GAIN

CROSS-REFERENCE TO RELATED APPLICATIONS

This application claims priority under 35 U.S.C. §119(a) from Korean Patent Application No. 10-2011-0070544 filed on Jul. 15, 2011, the disclosure of which is hereby incorporated by reference in its entirety.

BACKGROUND

The example embodiments relate to an image sensor, and more particularly, to a complementary metal-oxide-semiconductor (CMOS) image sensor for increasing conversion gain using a Miller effect.

A sensor including a pixel array, which senses effective physical quantity such as light intensity, temperature, mass, or time and outputs an electrical signal, is used in various areas. In particular, an image sensor measuring an image of a photographed object is applied to various fields.

SUMMARY

Some embodiments provide an image sensor for increasing conversion gain.

Some embodiments provide an image sensor for increasing conversion gain and sensitivity.

In one embodiment, the image sensor includes a first photodiode configured to convert an optical signal into a photocharge, a sensing node configured to store the photocharge of the first photodiode, and a circuit configured to selectively output an electrical signal corresponding to the photocharge at the sensing node on an output line. The circuit is connected to at least a first conductive contact, and the output line is disposed between the sensing node and the first conductive contact.

For example, the circuit may include a transfer transistor configured to transfer the photocharge to the sensing node. The transfer transistor is connected to the first conductive contact, and the output line is disposed between the sensing node and the first conductive contact.

In one embodiment, the transfer transistor has a gate connected to the first conductive contact for receiving a gate control signal.

In one embodiment, the circuit further includes a reset transistor configured to reset a voltage level of the sensing node, and the reset transistor is connected to a second conductive contact. The output line may be disposed between the sensing node and the second conductive contact.

In another embodiment, the circuit may includes a drive transistor configured to convert the photocharge into an electrical signal. The circuit may include a select transistor configured to control transfer of the electrical signal to the output line, and the select transistor is connected to a third conductive contact. The output line may be disposed between the sensing node and the third conductive contact.

In one embodiment, the output line surrounds the sensing node.

In another embodiment, the output line is disposed in a same plane as the sensing node.

In a further embodiment, the output line surrounds the third conductive contact.

In another embodiment, the image sensor further includes a second photodiode configured to convert the optical signal into a photocharge. Here, the sensing node is configured to store the photocharge of the second photodiode. In this embodiment, the circuit may include a first transfer transistor configured to transfer the photocharge of the first photodiode to the sensing node. The first transfer transistor connected to a first conductive contact. The circuit may also include a second transfer transistor configured to transfer the photocharge of the second photodiode to the sensing node. The second transfer transistor connected to a second conductive contact. The circuit may still further include a reset transistor configured to reset a voltage level of the sensing node. The reset transistor connected to a third conductive contact. Also a drive transistor may be configured to convert the photocharge at the sensing node into an electrical signal, and a select transistor may be configured to control transfer of the electrical signal to the output line. The select transistor is connected to a fourth conductive contact, and the output line is disposed between the sensing node and at least one of the first through fourth conductive contacts.

In another embodiment, the image sensor includes a second photodiode configured to convert the optical signal into a photocharge, a third photodiode configured to convert the optical signal into a photocharge, a fourth photodiode configured to convert the optical signal into a photocharge, and the sensing node is configured to store the photocharges of the first through fourth photodiodes. In this embodiment, the circuit may include a first transfer transistor configured to transfer the photocharge of the first photodiode to the sensing node, a second transfer transistor configured to transfer the photocharge of the second photodiode to the sensing node, a third transfer transistor configured to transfer the photocharge of the third photodiode to the sensing node, a fourth transfer transistor configured to transfer the photocharge of the fourth photodiode to the sensing node, a reset transistor configured to reset a voltage level of the sensing node, a drive transistor configured to convert the photocharge at the sensing node into an electrical signal, and a select transistor configured to control transfer of the electrical signal to the output line. The first transfer transistor is connected to a first conductive contact, the second transfer transistor is connected to a second conductive contact, the third transfer transistor is connected to a third conductive contact, the fourth transfer transistor is connected to a fourth conductive contact, the reset transistor is connected to a fifth conductive contact, and the select transistor is connected to a sixth conductive contact. The output line is disposed between the sensing node and at least one of the first through sixth conductive contacts.

In another embodiment, the image sensor includes a photodiode configured to convert an optical signal into a photocharge, a sensing node configured to store the photocharge, a circuit configured to selectively output an electrical signal corresponding to the photocharge at the sensing node on an output line, and the output line configured to shield the sensing node from at least one conductive contact.

In a further embodiment, image sensor includes one or more photodiodes, a sensing node, a transfer transistor associated with each of the one or more photodiodes and configured to transfer a photocharge from the associated photodiode to the sensing node, a reset transistor configured to reset a voltage level of the sensing node, a drive transistor configured to convert the photocharge at the sensing node into an electrical signal, a select transistor configured to control transfer of the electrical signal to an output line, and the output line. The output line is disposed between the sensing node and a conductive contact connected to one of the transfer transistors, the reset transistor, and the select transistor.

In a still further embodiment, the image sensor includes a pixel array. The pixel array includes a first photodiode configured to convert an optical signal into a photocharge, a sensing node configured to store the photocharge of the first photodiode, and a circuit configured to selectively output an electrical signal corresponding to the photocharge at the sensing node on an output line. The circuit is connected to at least a first conductive contact, and the output line disposed between the sensing node and the first conductive contact. The image sensor further includes an analog-to-digital converter configured to convert the electrical signal to a digital signal, a memory configured to store the digital signal, and a signal processor configured to process the digital signal stored in the memory.

In another embodiment, the image sensor includes a first photodiode configured to convert an optical signal into a photocharge, a sensing node configured to store the photocharge of the first photodiode, and a circuit configured to selectively output an electrical signal corresponding to the photocharge at the sensing node on an output line. The output line is disposed surrounding the sensing node.

Some example embodiment may also relate to applications of the image sensor such as a camera system, a computing system, etc.

Some example embodiments also relate to a method forming an image sensor.

In one embodiment, the method includes forming a pixel unit having a photodiode configured to convert an optical signal into a photocharge, a sensing node configured to store the photocharge, and a circuit configured to selectively output an electrical signal corresponding to the photocharge at the sensing node on an output line. The method further includes forming the output line such that the output line is disposed between the sensing node and at least one conductive contact of the circuit.

At least one embodiment relates to an integrated circuit.

In one embodiment, the integrated circuit includes a substrate, at least first and second gate structures formed on the substrate, an insulating layer disposed over the substrate, first and second contacts disposed on the insulating layer and electrically connected to the first and second gate structures, respectively, and a sensing node electrically connected to the first contact. At least a portion of a conductive line is disposed on the insulating layer between the sensing node and the second contact.

BRIEF DESCRIPTION OF THE DRAWINGS

The above and other features and advantages of the example embodiments will become more apparent by describing in detail embodiments with reference to the attached drawings in which.

DETAILED DESCRIPTION OF EXAMPLE EMBODIMENTS

Figure 1A:
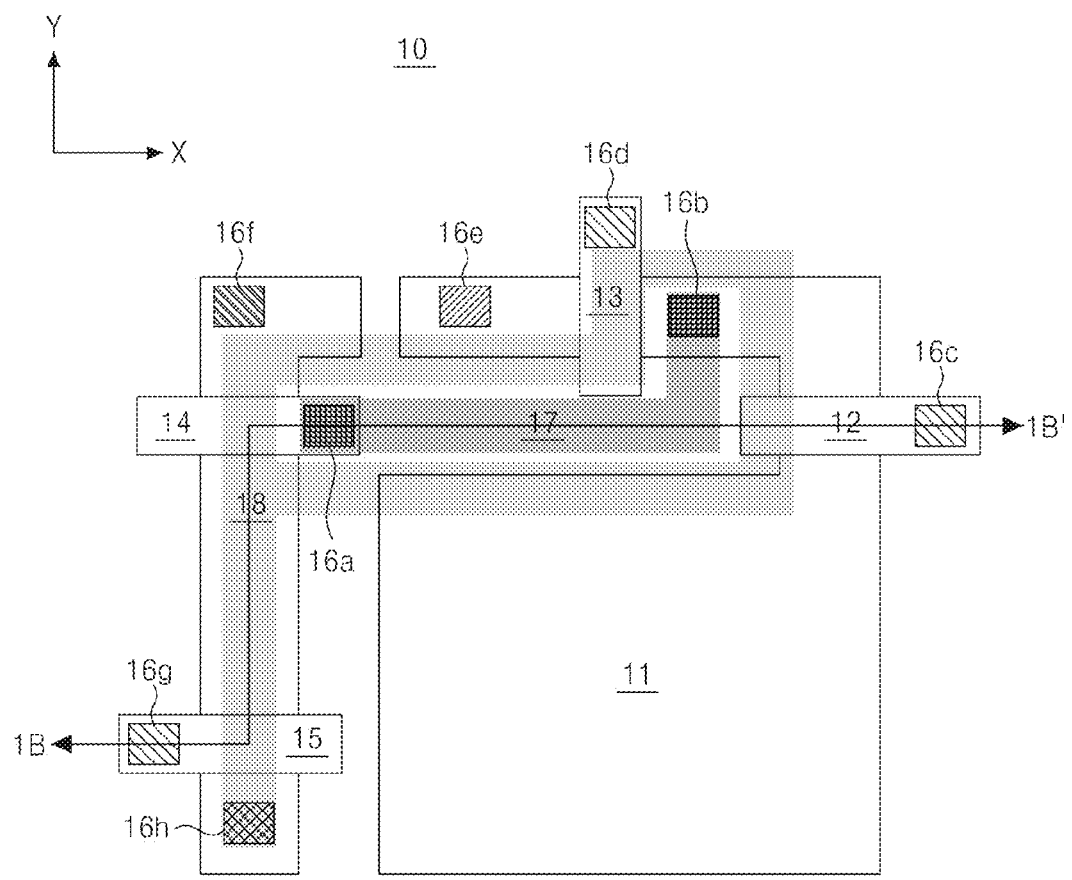
FIG. 1A is a plan view of a unit pixel in an image sensor according to an example embodiment.

Example embodiments now will be described more fully hereinafter with reference to the accompanying drawings, in which the embodiments are shown. The example embodiment may, however, be embodied in many different forms and should not be construed as limited to those set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1A is a plan view of a unit pixel 10 in an image sensor according to an example embodiment.

Referring to FIG. 1A, the pixel 10 includes a light receiving area (e.g., a photodiode) 11, a transfer gate 12 included in a transfer transistor, a reset gate 13 included in a reset transistor, a drive gate 14 included in a drive transistor, and a select gate 15 included in a select transistor.

The transfer gate 12 may receive a gate control signal through a metal contact 16c. The reset gate 13 may receive a gate control signal through a metal contact 16d. The select gate 15 may receive a gate control signal through a metal contact 16g.

A drain terminal of the reset transistor may receive a reset voltage through a metal contact 16e. A drain terminal of the drive transistor may be connected to a power supply voltage node through a metal contact 16f. The drive gate 14 is connected to a source terminal of the reset transistor through a metal contact 16a and a metal contact 16b.

A sensing node may include a parasitic capacitor formed through the two metal contacts 16a and 16b. The source terminal of the reset transistor may be referred to as a floating diffusion (FD) node or the sensing node 17. A source terminal of the select transistor is connected to an output line 18 through a metal contact 16h. The output line 18 may be disposed to extend from a portion connected to the metal contact 16h and surround the sensing node 17. Since the output line 18 is disposed to surround the sensing node 17, the sensing node 17 is isolated from the metal contacts 16c, 16d, and 16g of the respective gates 12, 13, and 15, so that parasitic capacitance between the sensing node 17 and each of the metal contacts 16c, 16d, and 16g of the respective gates 12, 13, and 15 can be reduced.

The output line 18 may be disposed to surround only at least part of the metal contacts 16c, 16d, and 16g instead of surrounding the sensing node 17. The metal contacts 16a through 16h may be replaced with different types of contacts having conductivity like poly silicon. The drive transistor may include a source follower structure.

To at least shield and may be isolate the sensing node 17 from the metal contacts 16c, 16d, and 16g of the respective gates 12, 13, and 15, the output line 18 may be disposed to surround the sensing node 17 or to surround only at least part of the metal contacts 16c, 16d, and 16g, as described above, or the output line 18 may be disposed to be positioned between the sensing node 17 and at least one of the metal contacts 16c, 16d, and 16g. However, the example embodiments are not restricted to these embodiments.

Through the disposition of the output line 18, effective capacitance of the sensing node 17 can be reduced due to the Miller effect between the parasitic capacitor between the sensing node 17 and the output line 18 and the drive transistor having the source follower structure. The reduction of the effective capacitance of the sensing node 17 leads to an increase of an output voltage. As a result, conversion gain of the image sensor is increased. The Miller effect in a pixel will be described in detail below.

Figure 1B:
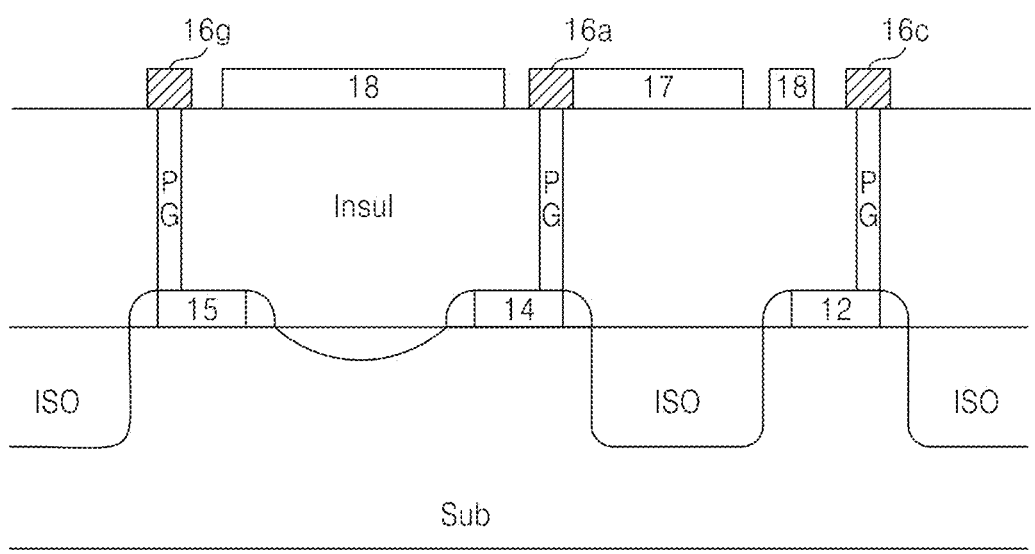
FIG. 1B is a cross-sectional view of the unit pixel in FIG. 1A along line 1B-1B'.

FIG. 1B is a cross-sectional view of the unit pixel in FIG. 1A along line 1B-1B'. As shown, gate 12 and gates 14 and 15 are respectively formed on active regions of the substrate Sub separated by isolation regions ISO. An insulating layer Insul is formed over the gates 12, 14 and 15. Plugs PG are formed in the insulating layer Insul, each electrically connected to (e.g., contacting) a respective one of the gates 12, 14 and 15. Contacts 16g, 16a and 16c are electrically connected (e.g., contacting) the plugs PG for the gates 12, 14 and 15, respectively. The sensing node 17 is disposed on the insulating layer Insul and electrically connected with (e.g., contacting) the contact 16a. A portion of the output line 18 is disposed between the contact 16g and the sensing node 17, and another portion is disposed between the contact 16c and the sensing node 17. As further shown, the contacts 16a, 16g, 16c, the sensing node 17 and the output line 18 lie in a same plane on the insulating layer Insul.

Figure 2A:
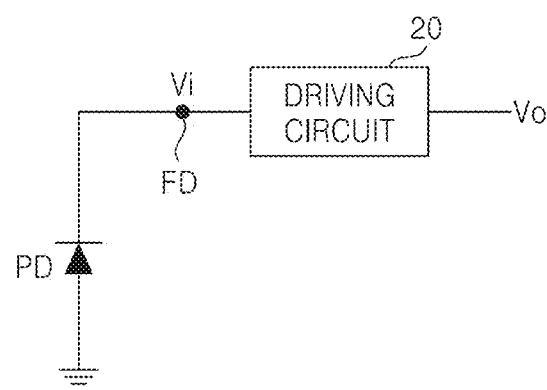
FIG. 2A is a diagram for explaining a Miller effect in a unit pixel of an image sensor.
Figure 2B:
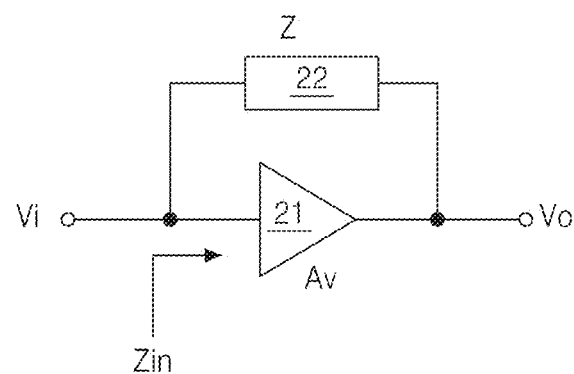
FIG. 2B is a schematic equivalent circuit diagram of a driving circuit illustrated in FIG. 2A.

FIG. 2A is a diagram for explaining the Miller effect in a unit pixel of an image sensor. FIG. 2B is a schematic equivalent circuit diagram of a driving circuit 20 illustrated in FIG. 2A. Referring to FIG. 2A, the unit pixel includes a photodiode PD, a sensing node FD, the driving circuit 20, and an output line. The photodiode PD converts a received optical signal into a photocharge. The sensing node FD is adjacent to the photodiode PD and senses the photocharge. The driving circuit 20 converts the photocharge at the sensing node FD into an electrical signal Vo. The output line is connected to the driving circuit 20 and outputs the electrical signal Vo.

Referring to FIG. 2B, the driving circuit 20 includes an amplifier 21 connected to a feedback loop through an element 22 having an impedance Z. According to the Miller effect, impedance between the input and output terminals of an amplifier circuit having voltage gain is in inverse proportion to the voltage gain.

In detail, the output voltage Vo is expressed by the product of a gain Av of the amplifier 21 and an input voltage Vi, that is, Vo=AvVi.

Current flowing in the driving circuit 20 illustrated in FIGS. 2A and 2B may be expressed by Ii=(Vi−Vo)/Z=Vi(1−Av)/Z on the assumption that current does not flow into the amplifier 21.

At this time, an input impedance Zin viewed from the input terminal of the amplifier 21 is obtained by dividing the input voltage Vi by the current Ii and thus expressed by Zin=Vi/Ii=ViZ/Vi(1−Av)=Z/(1−Av).

It has been stated that the impedance between the input and output terminals is in inverse proportion to the voltage gain in the above description of the Miller effect, which is the case when the amplifier is an inverting amplifier having a negative gain.

However, the amplifier 21 of the driving circuit 20 illustrated in FIGS. 2A and 2B is a source follower and the gain Av of the amplifier 21 has a positive value less than 1, e.g., 0.75 or 0.85. Accordingly, the impedance Zin viewed from the input terminal increases in proportion to the impedance Z. Meanwhile, when the impedance Z includes capacitance C, the impedance Z is expressed by Z=1/jwC. Accordingly, the impedance Zin viewed from the input terminal is expressed by Zin=1/(jwC(1−Av))=1/jwC$_{eff}$ where C$_{eff}$ is capacitance viewed from the input terminal and is expressed by C$_{eff}$=C(1−Av).

Therefore, the effective capacitance $C_{eff}$ is decreased in a CMOS image sensor. As the effective capacitance $C_{eff}$ decreases, conversion gain increases, and therefore, the output voltage Vo increases.

The input voltage Vi illustrated in FIGS. 2A and 2B may include a voltage of the sensing node FD (i.e. a sensing voltage in the CMOS image sensor) and the output voltage Vo may include an output voltage of the pixel.

Figure 3:
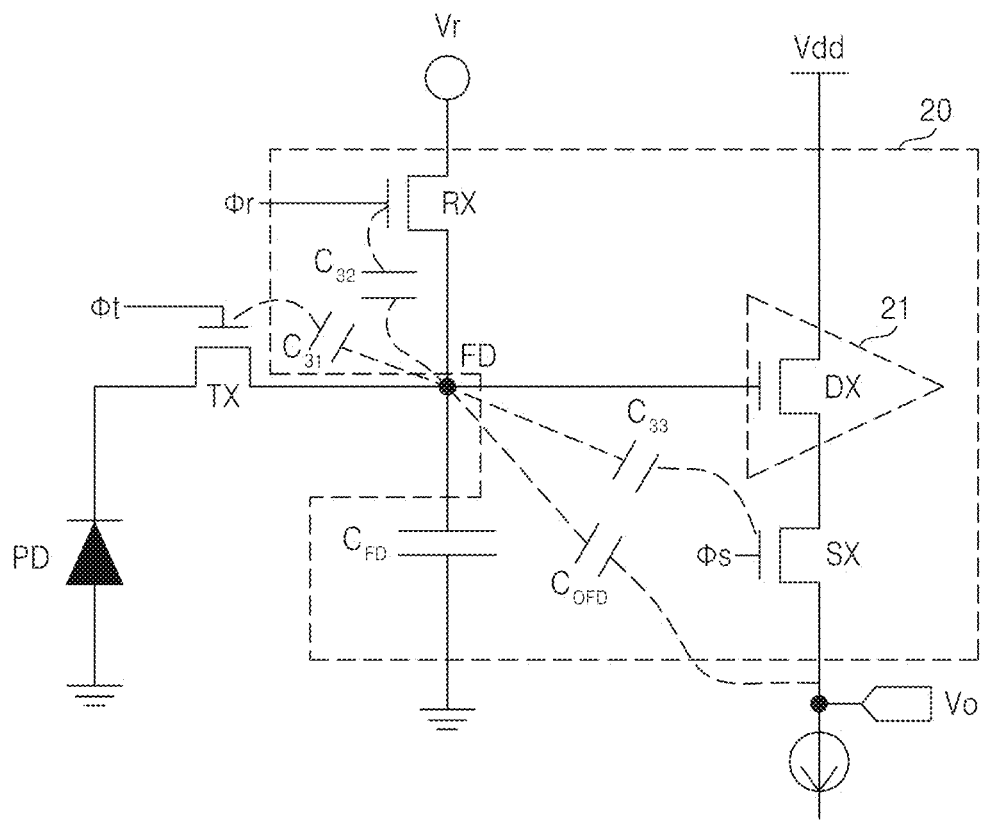
FIG. 3 is a detailed circuit diagram of a pixel corresponding to FIGS. 2A and 2B.

FIG. 3 is a detailed circuit diagram of a pixel 30 corresponding to FIGS. 2A and 2B.

The pixel 30 illustrated in FIG. 3 includes four transistors Tx, Rx, Dx, and Sx and a single photodiode PD. The four transistors Tx, Rx, Dx, and Sx include the transfer transistor Tx having a gate terminal controlled by gate control signal Φt, the reset transistor Rx having a gate terminal controlled by gate control signal Φr, the drive transistor Dx amplifying a voltage of a sensing node FD through a source follower structure, and the select transistor Sx having a gate terminal controlled by gate control signal Φs.

The driving circuit 20 illustrated in FIGS. 2A and 2B may include the reset transistor Rx, the drive transistor Dx, and the select transistor Sx. The driving circuit 20 may also include the transfer transistor Tx. The amplifier 21 may include the drive transistor Dx.

The sensing node FD may include a parasitic capacitor $C_{FD}$ formed through metal contacts among the gate terminal of the drive transistor Dx, a source terminal of the reset transistor Rx, and a drain terminal of the transfer transistor Tx.

A parasitic capacitor may exist between the sensing node FD and each of peripheral metal contacts. A parasitic capacitor $C_{32}$ exists between the gate terminal of the reset transistor Rx and the sensing node FD. A parasitic capacitor $C_{31}$ exists between the gate terminal of the transfer transistor Tx and the sensing node FD. A parasitic capacitor $C_{33}$ exists between the gate terminal of the select transistor Sx and the sensing node FD. A parasitic capacitor $C_{OFD}$ may exist between an output terminal Vo and the sensing node FD.

The parasitic capacitor $C_{OFD}$ existing between the output terminal Vo and the sensing node FD may correspond to the element 22 having the impedance Z in FIG. 2B.

Accordingly, the parasitic capacitor $C_{OFD}$ existing between the output terminal Vo and the sensing node FD cancels the other parasitic capacitors $C_{31}$, $C_{32}$, and $C_{33}$, thereby increasing the conversion gain of a CMOS image sensor. This can be realized using the layout illustrated in FIG. 1. This can be caused by a physical factor that prevents the parasitic capacitors $C_{31}$, $C_{32}$, and $C_{33}$ from being created through the layout of the output line.

Figure 4A:
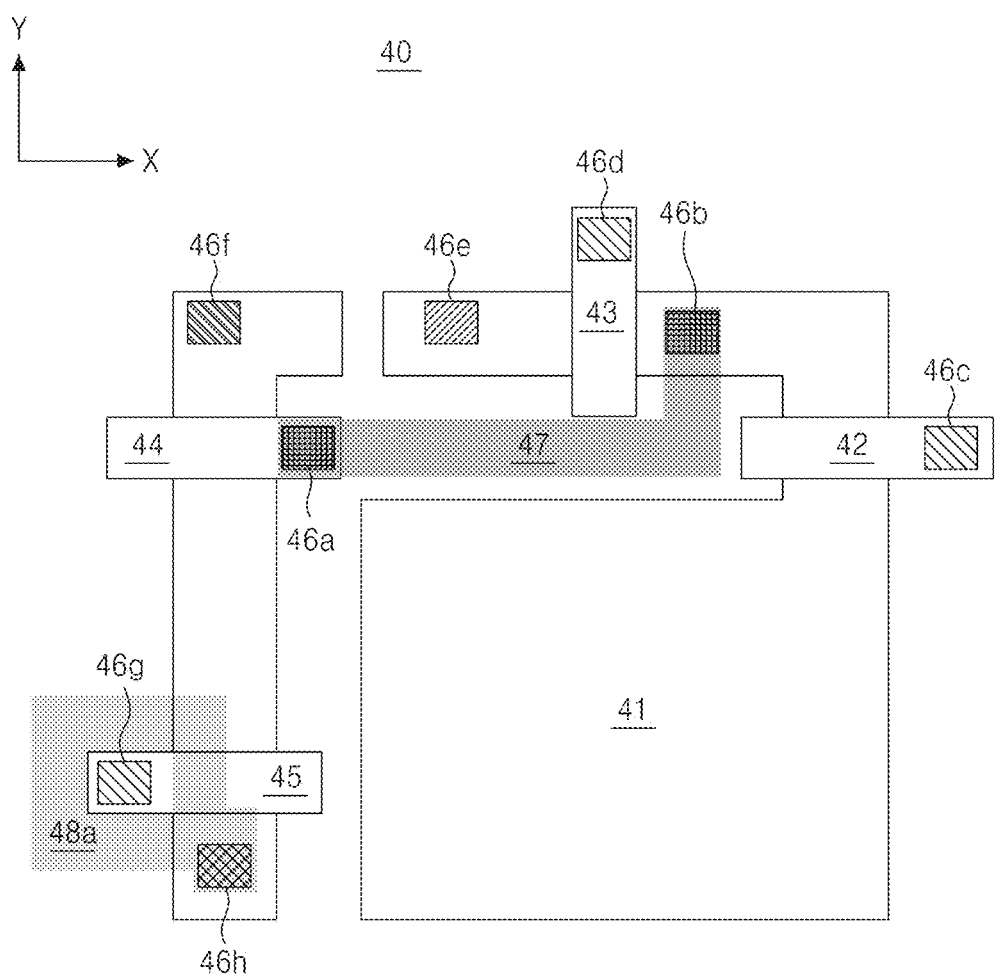
FIGS. 4A and 4B are plan views of a unit pixel in an image sensor according to example embodiments.
Figure 4B:
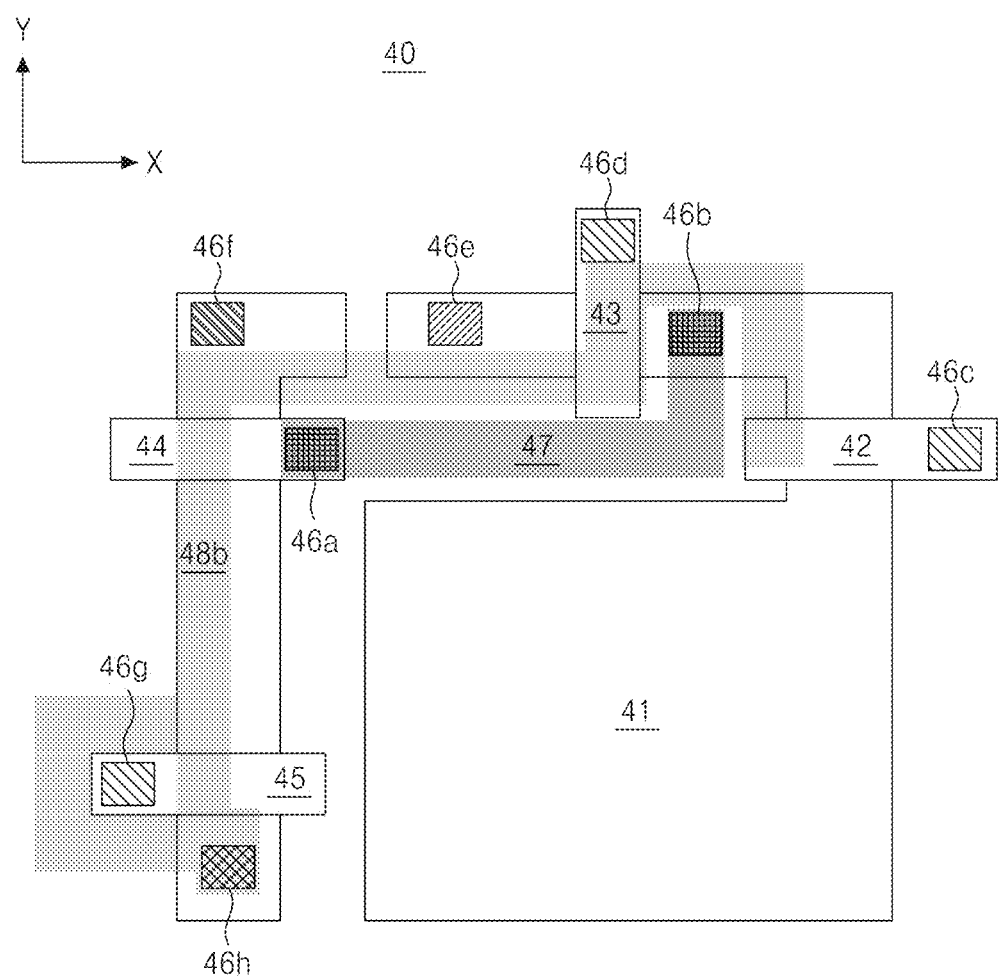

FIGS. 4A and 4B are plan views of a unit pixel in an image sensor according to example embodiments;

A structure illustrated in FIG. 4A is the same as that illustrated in FIG. 1 except for the layout of an output line 48a and different reference numerals. The output line 48a is connected to a metal contact 46h connected to a source terminal of a select transistor and extends therefrom to surround a metal contact 46g of a select gate 45. Accordingly, a parasitic capacitor between a sensing node 47 and the metal contact 46g of the select gate 45 is at least reduced and may be cancelled by a parasitic capacitor between the sensing node 47 and the output line 48a.

Apart from the metal contact 46g, the output line 48a may be disposed to surround at least one among a metal contact 46c of a transfer gate 42 and a metal contact 46d of a reset gate 43, so that a parasitic capacitor between the sensing node 47 and each of the metal contacts 46c, 46d, and 46g is reduced and/or cancelled. The output line 48a may be disposed between each of the metal contacts 46c, 46d, and 46g and the sensing node 47 instead of surrounding the metal contacts 46c, 46d, and 46g. Accordingly, the sensing node 47 is shielded, and may be isolated from the metal contacts 46c, 46d, and 46g.

In the above embodiments, metal contacts 46a through 46h are used, but any other contacts having conductivity may be used.

Referring to FIG. 4B, the output line 48a is disposed to surround the metal contact 46g of the select gate 45 and is extended to be positioned between the sensing node 47 and each of the metal contacts 46c and 46d of the respective transfer and reset gates 42 and 43. Through this layout, a parasitic capacitor between the sensing node 47 and each of the metal contacts 46c, 46d, and 46g is reduced and may be cancelled.

Figure 5:
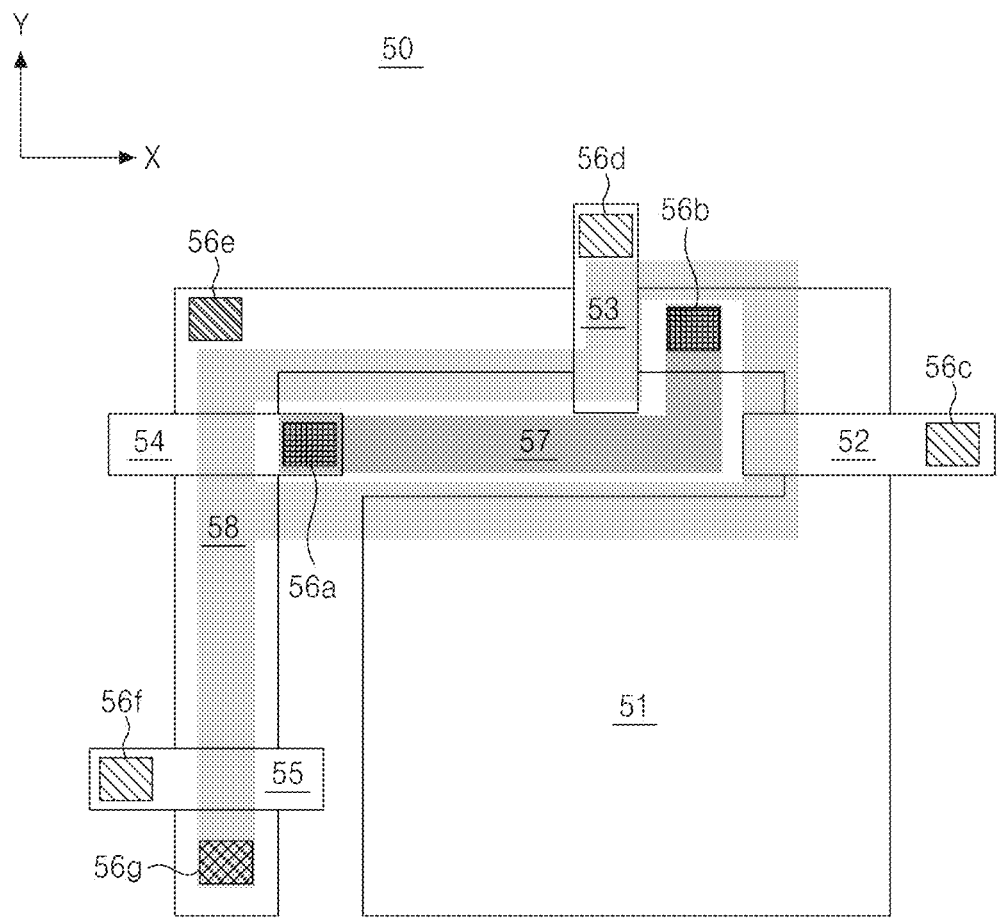
FIG. 5 is a plan view of a unit pixel in an image sensor according to an example embodiment.

FIG. 5 is a plan view of a unit pixel 50 in an image sensor according to an example embodiment. A structure illustrated in FIG. 5 is the same as that illustrated in FIG. 1 except for a metal contact 56e and different reference numerals. An output line 58 also has the same layout as the output line 18 illustrated in FIG. 1. Referring to FIG. 5, a reset transistor and a drive transistor are connected to a power supply voltage node in common through a source terminal due to the metal contact 56e. Accordingly, a reset voltage may be controlled using a power supply voltage level or a variable voltage level.

Figure 6:
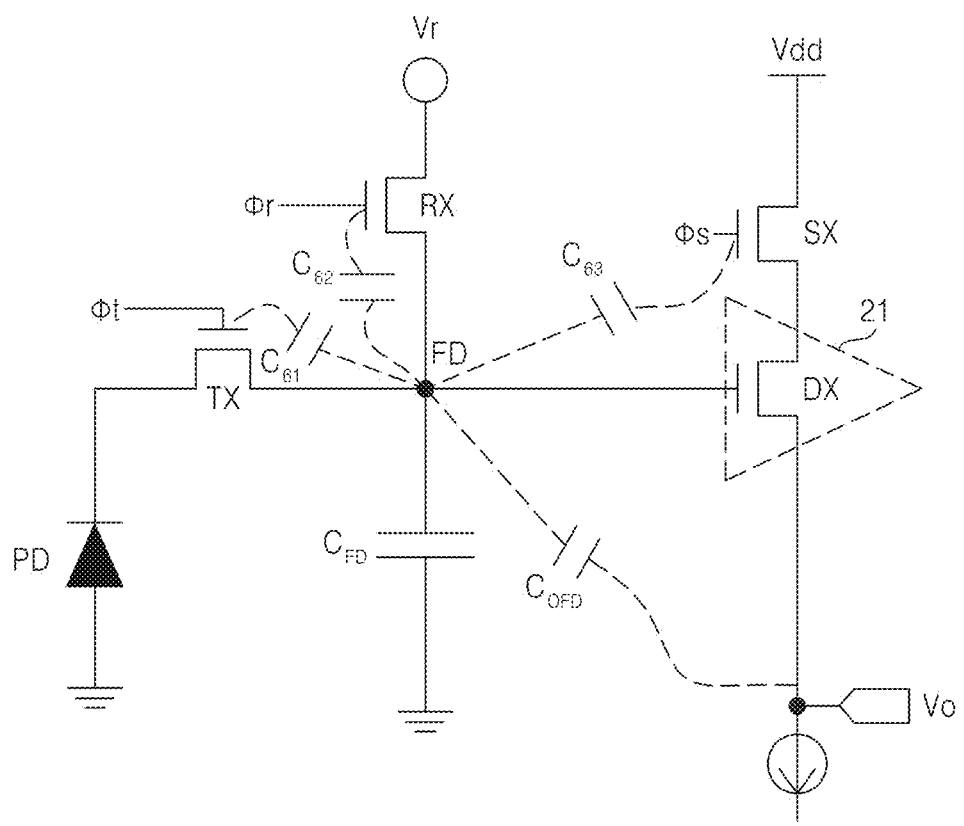
FIG. 6 is a detailed circuit diagram of a unit pixel in an image sensor according to an example embodiment.

FIG. 6 is a detailed circuit diagram of a unit pixel 60 in an image sensor according to an example embodiment. Unlike the pixel 30 illustrated in FIG. 3, the pixel 60 illustrated in FIG. 6 includes a select transistor Sx connected between a power supply voltage node Vdd and a drive transistor Dx. Accordingly, it can be inferred that an output terminal is connected to a source terminal of the drive transistor Dx. Parasitic capacitors are denoted by $C_{61}$, $C_{62}$, and $C_{63}$.

Figure 7A:
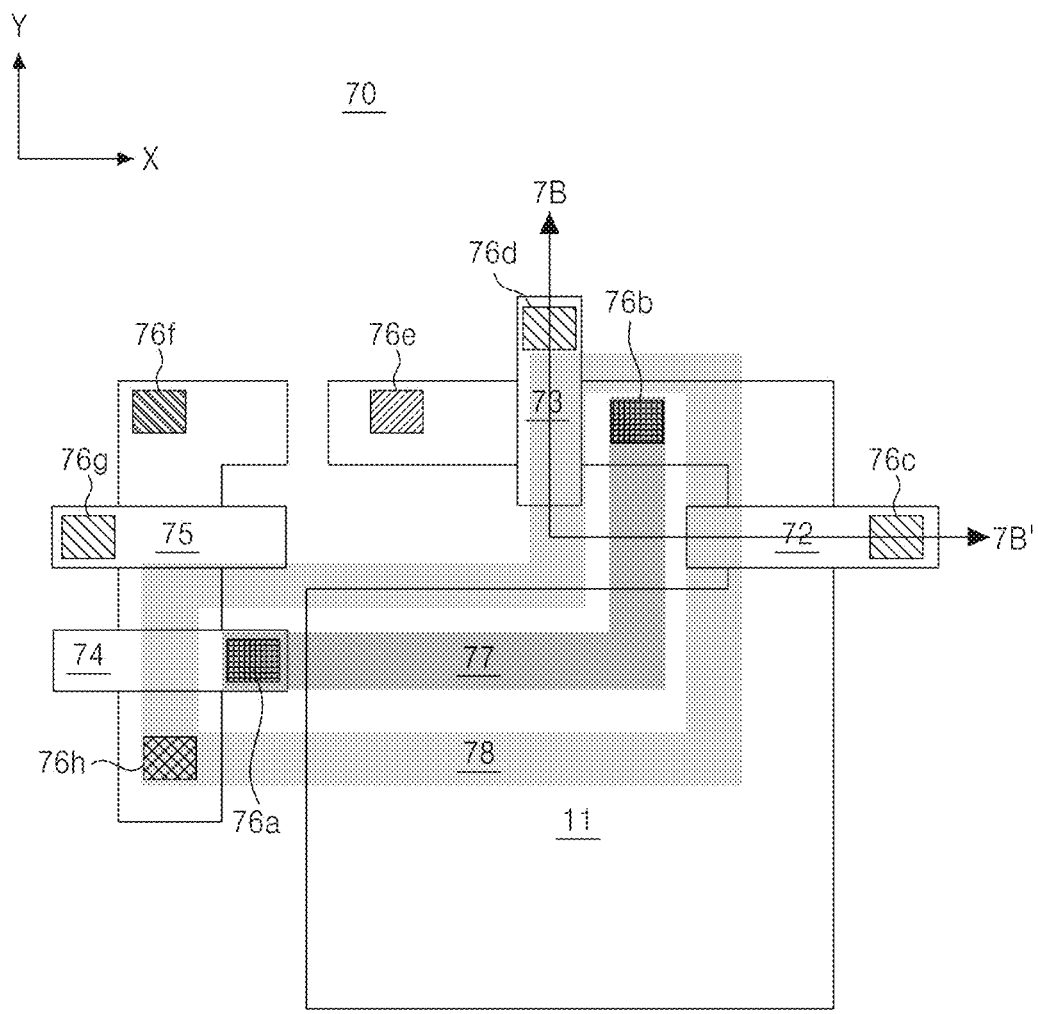
FIG. 7A is a plan view of a unit pixel in an image sensor according to an example embodiment.

FIG. 7A is a plan view of a unit pixel 70 in an image sensor according to an example embodiment. FIG. 7A corresponds to the detailed circuit diagram illustrated in FIG. 6.

A structure illustrated in FIG. 7A is almost the same as that illustrated in FIG. 1A except for a position of a select gate 75 included in the select transistor Sx illustrated in FIG. 6 and different reference numerals. A drain terminal of the select gate 75 contacts a metal contact 76f so that the select gate 75 is connected to a power supply voltage node.

A sensing node 77 and an output line 78 are disposed in the same manner as the sensing node 17 and the output line 18 illustrated in FIG. 1A. In other words, the output line 78 is disposed to surround the sensing node 77, thereby isolating the sensing node 77 from metal contacts 76c, 76d, and 76g. As a result, a parasitic capacitor between the sensing node 77 and each of the metal contacts 76c, 76d, and 76g is reduced and may be cancelled and the capacitance of a parasitic capacitor between the sensing node 77 and the output line 78 is increased.

Figure 7B:
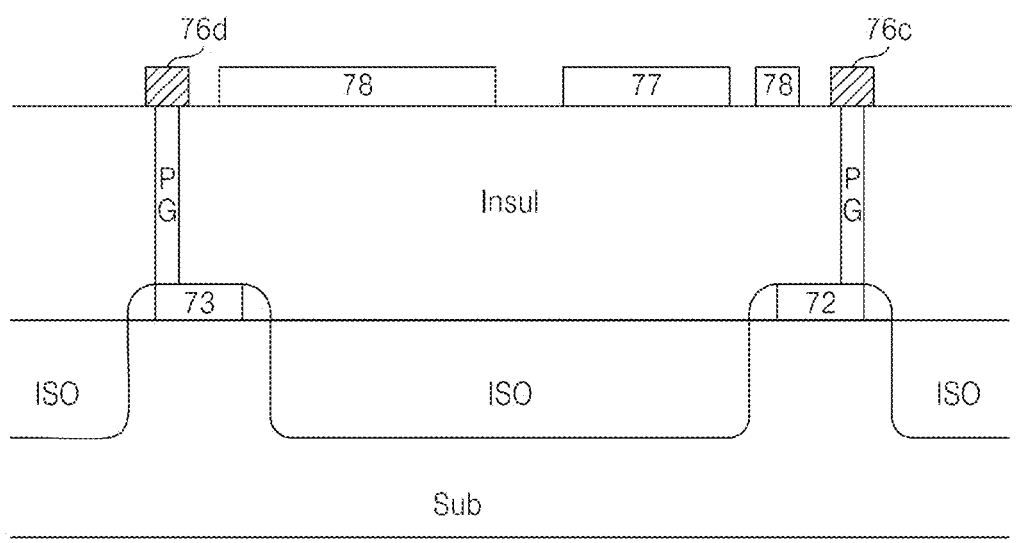
FIG. 7B is a cross-sectional view of the unit pixel in FIG. 1A along line 7B-7B'.

FIG. 7B is a cross-sectional view of the unit pixel in FIG. 7A along line 7B-7B'. As shown, gate 72 and 73 are respectively formed on active regions of the substrate Sub separated by isolation regions ISO. An insulating layer Insul is formed over the gates 72 and 73. Plugs PG are formed in the insulating layer Insul, each electrically connected (e.g., contacting) a respective one of the gates 72 and 73. Contacts 76c and 76d are electrically connected to (e.g., contacting) the plugs PG for the gates 72 and 73, respectively. The sensing node 77 is disposed on the insulating layer Insul between contacts 76c and 76d. A portion of the output line 18 is disposed between the contact 76c and the sensing node 77, and another portion is disposed between the contact 76d and the sensing node 77.

As further shown, the contacts 76c and 76d, the sensing node 77 and the output line 78 lie in a same plane on the insulating layer Insul.

Figure 8:
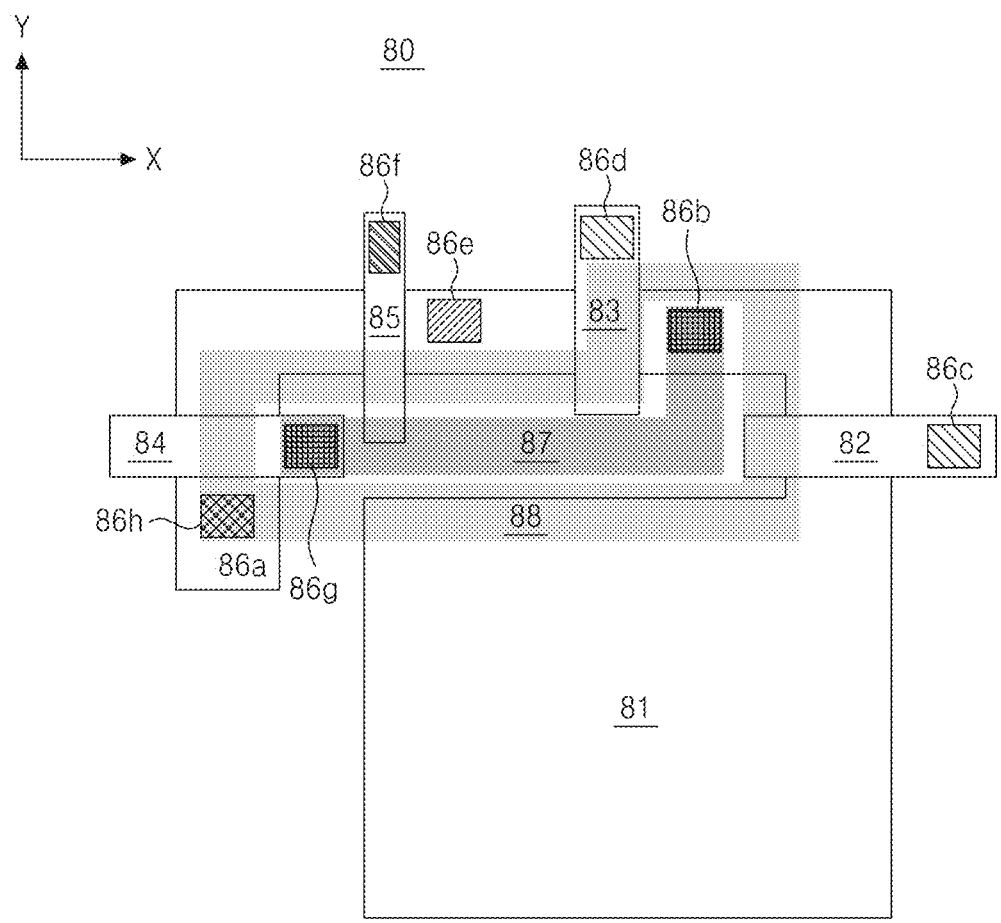
FIG. 8 is a plan view of a unit pixel in an image sensor according to an example embodiment.

FIG. 8 is a plan view of a unit pixel 80 in an image sensor according to an example embodiment. FIG. 8 corresponds to the detailed circuit diagram illustrated in FIG. 6. A structure illustrated in FIG. 8 is almost the same as that illustrated in FIG. 7 except that a select transistor and a reset transistor are connected to a power supply voltage node in common through a metal contact 86e and different reference numerals are used. Descriptions of the same structure and operation will be omitted.

Figure 9:
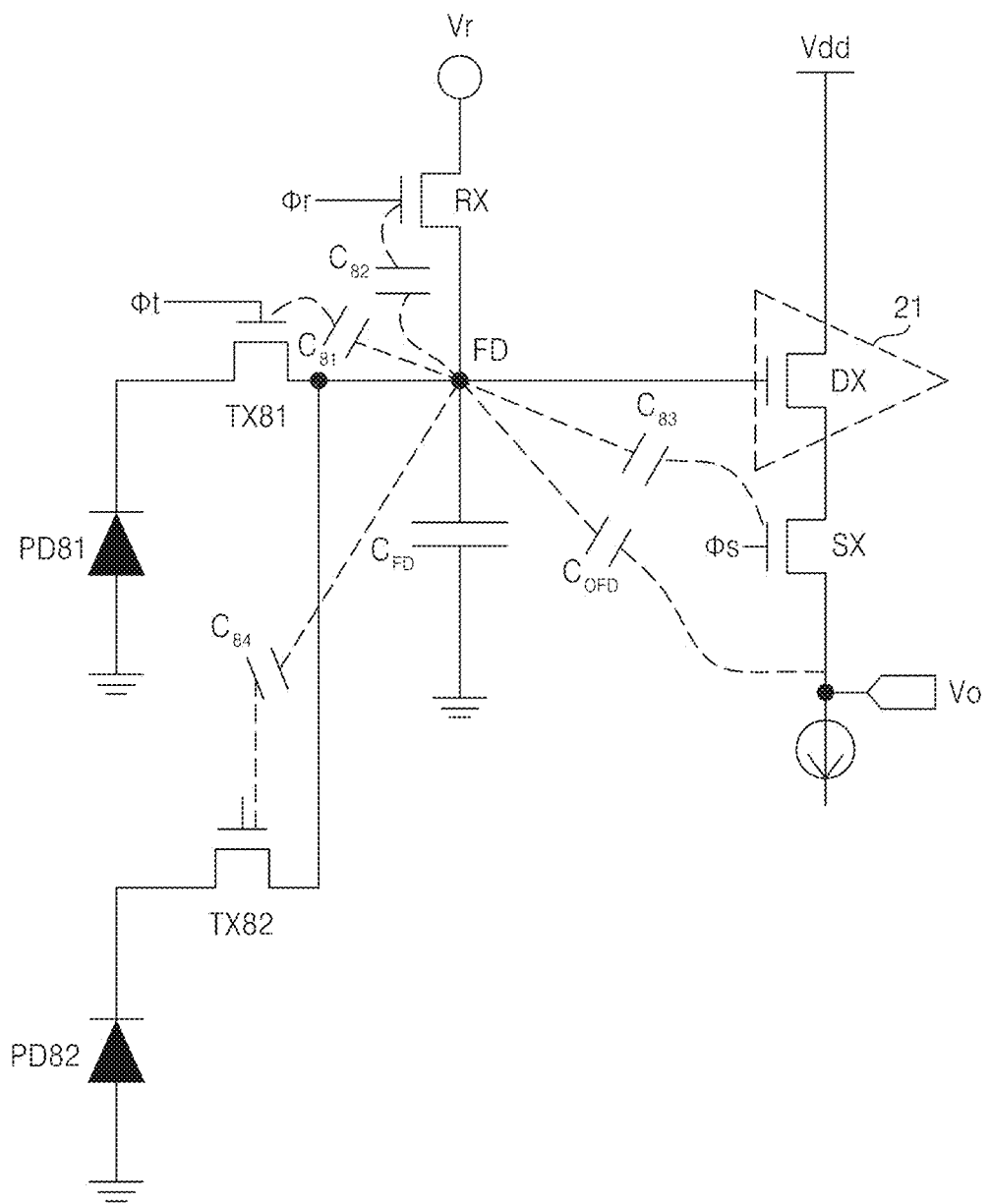
FIG. 9 is a detailed circuit diagram of pixels in an image sensor having a two pixel sharing structure.

FIG. 9 is a detailed circuit diagram of pixels in an image sensor having a two pixel sharing structure.

Referring to FIG. 9, two adjacent pixels include photodiodes PD81 and PD82, respectively, and transfer transistors Tx81 and Tx82, respectively, and the two pixels share transistors Rx, Dx, and Sx. In the current embodiments, each pixel includes four transistors, but the number of transistors included in each pixel may be changed.

In detail, the two pixels share a sensing node FD, the reset transistor Rx, the drive transistor Dx, and the select transistor Sx.

Parasitic capacitors existing between the sensing node FD and adjacent conductive material include a parasitic capacitor $C_{OFD}$ between the sensing node FD and an output terminal, a parasitic capacitor $C_{83}$ between the sensing node FD and a select gate, a parasitic capacitor $C_{82}$ between the sensing node FD and a reset gate, a parasitic capacitor $C_{81}$ between the sensing node FD and a first transfer gate, and a parasitic capacitor $C_{84}$ between the sensing node FD and a second transfer gate.

Figure 10A:
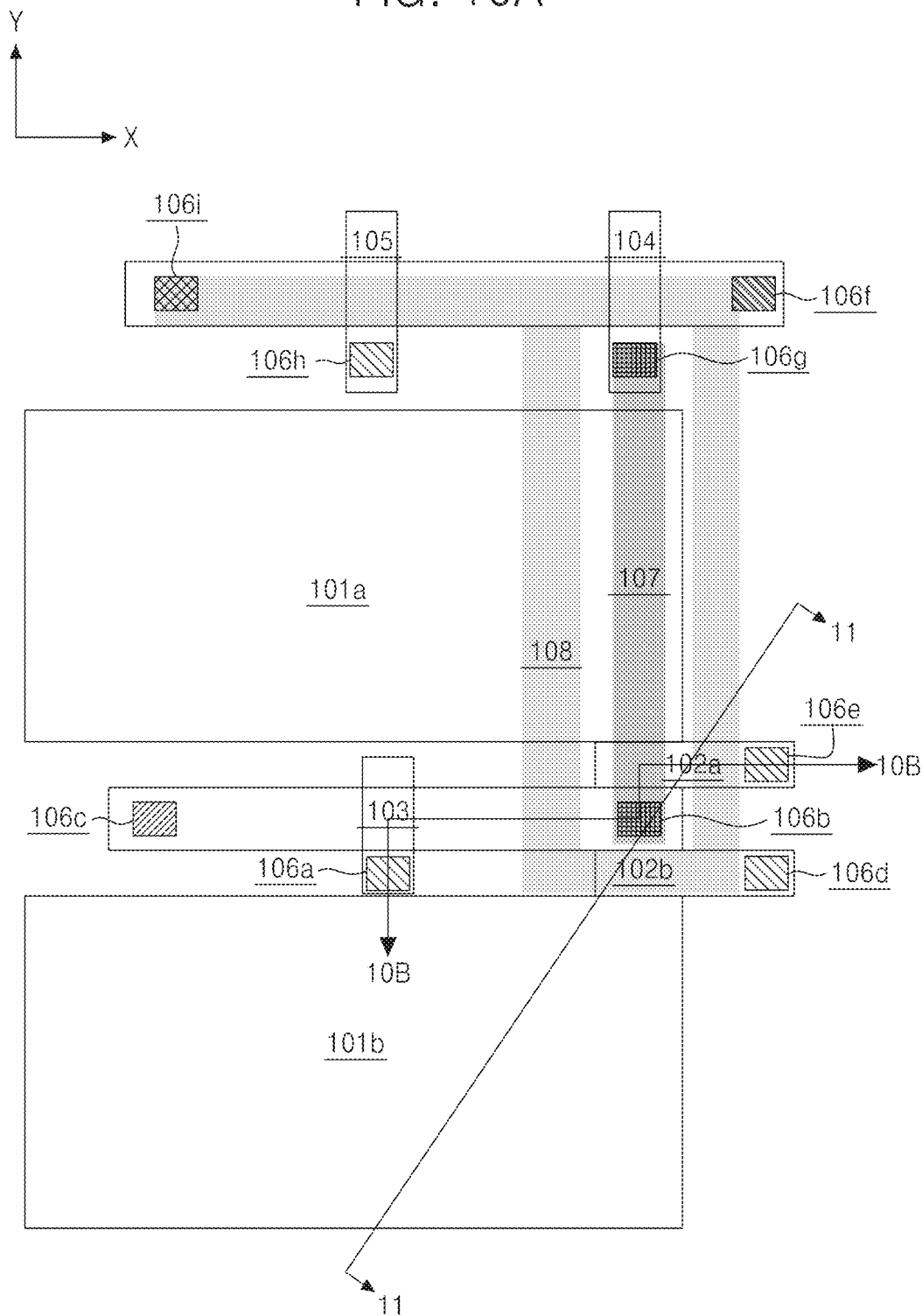
FIG. 10A is a plan view of the pixels illustrated in FIG. 9.

FIG. 10A is a plan view of the pixels illustrated in FIG. 9.

Referring to FIG. 10A, two photodiodes 101a and 101b and two transfer gates 102a and 102b are provided. Since a single reset gate 103, a single sensing node 107, a single drive gate 104, and a single select gate 105 are provided, they are shared by the two pixels. The sensing node 107 is formed using a metal contact 106b, which is connected to source terminals between the two transfer gates 102a and 102b in common, and a metal contact 106g of the drive gate 104. An output line 108 is connected to a metal contact 106i connected to a source terminal of a select transistor and extended therefrom to surround the sensing node 107.

In a shared pixel structure illustrated in FIG. 10A, the sensing node 107 and the output line 108 are disposed to overlap with the photodiode 101a. Since the structure may cause a side effect of hindering incident light from entering the photodiode 101a, the shared structure illustrated in FIG. 10 will be appropriate to a backside illumination sensor (BIS).

When the structure is applied to a front side illumination sensor, it is necessary to change a part of the layout so that the sensing node 107 and the output line 108 do not overlap with the photodiode 101a.

Figure 10B:
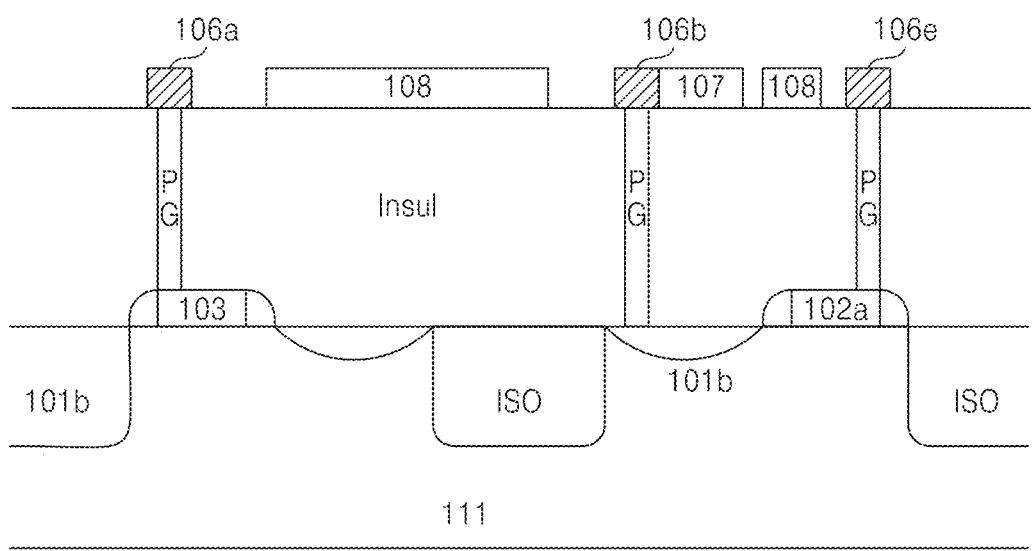
FIG. 10B is a cross-sectional view of the pixel in FIG. 10A along line 10B-10B'.

FIG. 10B is a cross-sectional view of the unit pixel in FIG. 10A along line 10B-10B'. As shown, gates 102a and 103 are respectively formed on active regions of the substrate Sub separated by isolation regions ISO. An insulating layer Insul is formed over the gates 102a and 103. Plugs PG are formed in the insulating layer Insul, each electrically connected (e.g., contacting) a respective one of the gates 102a and 103. Furthermore a plug PG also contacts the photodiode region 101b. Contacts 106e, 106b and 106a are electrically connected to (e.g., contacting) the plugs PG for the gate 102a, the photodiode region 101b and the gate 103, respectively. The sensing node 107 is disposed on the insulating layer Insul and electrically connected (e.g., contacting) with the contact 106b. A portion of the output line 108 is disposed between the contact 106e and the sensing node 107, and another portion is disposed between the contact 106a and the sensing node 107. As further shown, the contacts 106e, 106b, 106a, the sensing node 107 and the output line 108 lie in a same plane on the insulating layer Insul.

Figure 11:
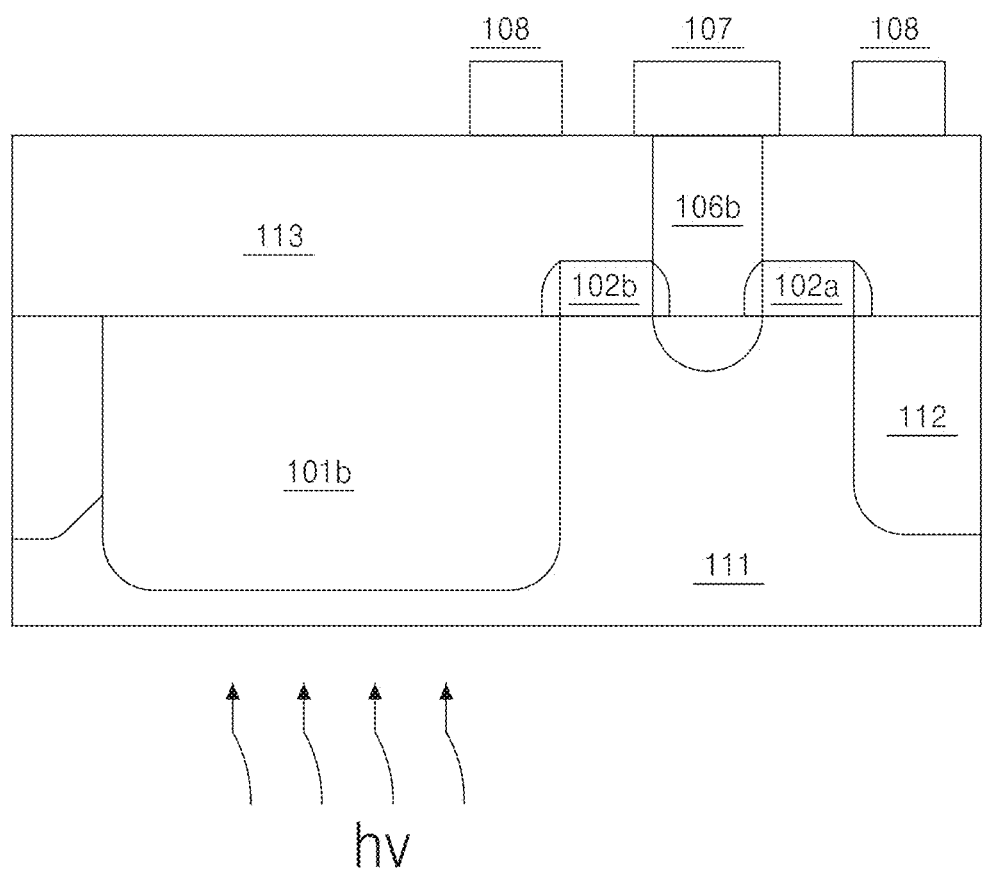
FIG. 11 is a cross-sectional view of the pixels, taken along the line 11-11' illustrated in FIG. 10.

FIG. 11 is a cross-sectional view of the pixels, taken along the line 11-11' illustrated in FIG. 10A.

Referring to FIG. 11, the photodiode 101b and an isolation insulating layer 112 are disposed on a substrate 111. The two transfer gates 102a and 102b are provided to be adjacent to each other on the substrate 111 adjacent to the photodiode 101b. A source/drain terminal between the two transfer gates 102a and 102b is connected to a driver gate (not shown) through the metal contact 106b. A parasitic capacitor formed by this connection functions as the sensing node 107. The output line 108 connected to a source terminal of the select transistor and extended therefrom is disposed at both sides of the sensing node 107. A capacitor formed between portions of the output line 108 disposed at both sides of the sensing node 107 functions as a feedback capacitor between the output line 108 and the sensing node 107. The feedback capacitor reduces effective capacitance due to the above-described Miller effect, thereby increasing conversion gain. In addition, parasitic capacitance between the sensing node 107 and each of metal contacts around the sensing node 107, which affects the Miller effect, is reduced, so that the Miller effect by the feedback capacitor using the parasitic capacitor between the sensing node 107 and the output line 108 is maximized.

In a structure illustrated in FIG. 11, light is received through the backside of the substrate 111. Accordingly, even when the output line 108 is disposed on the photodiode 101b, light sensitivity is not reduced.

Figure 12:
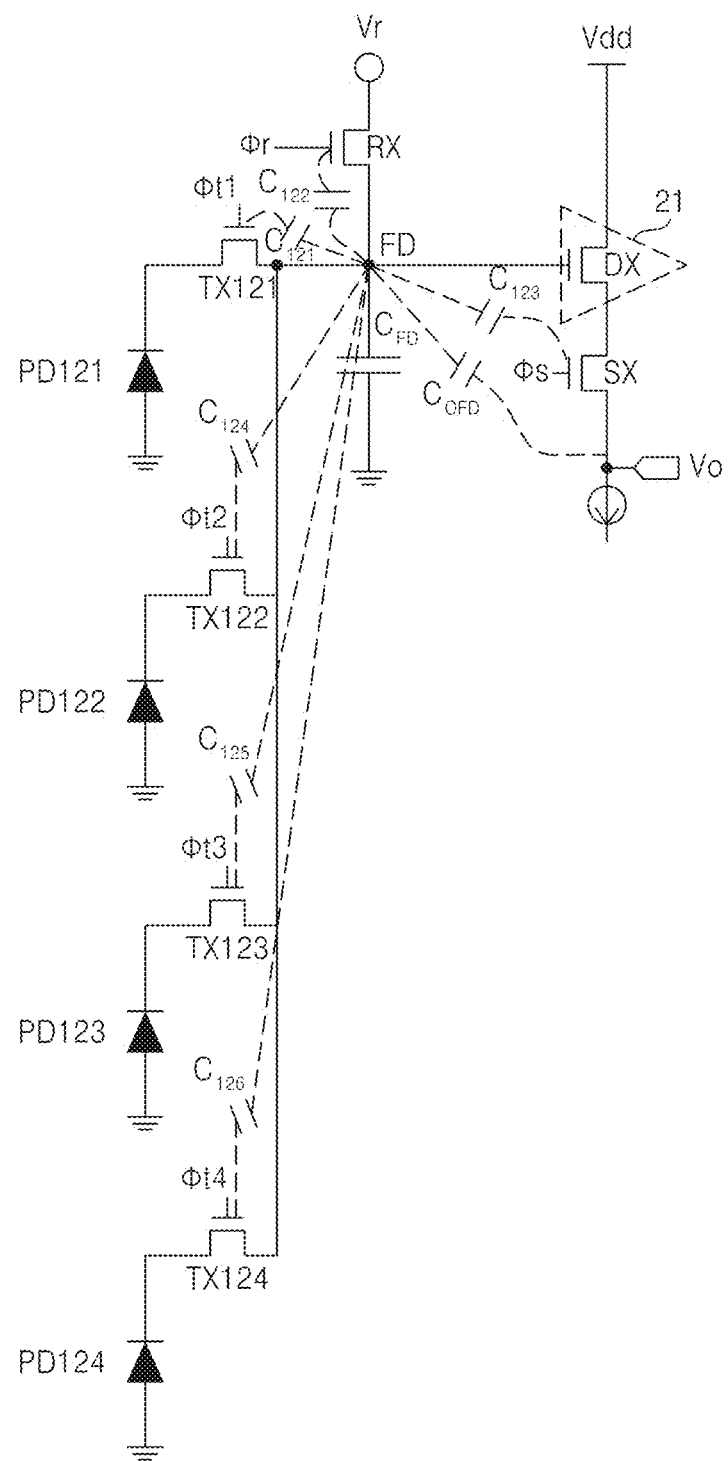
FIG. 12 is a detailed circuit diagram of pixels in an image sensor having a four pixel sharing structure.

FIG. 12 is a detailed circuit diagram of pixels in an image sensor having a four pixel sharing structure.

Referring to FIG. 12, four adjacent pixels include photodiodes PD121, PD122, PD123, and PD124, respectively, and transfer transistors Tx121, Tx122, Tx123, and Tx124, respectively, and share transistors Rx, Dx, and Sx. In the current embodiments, each pixel includes four transistors, but the number of transistors included in each pixel may be changed.

In detail, the four pixels share a sensing node FD, the reset transistor Rx, the drive transistor Dx, and the select transistor Sx.

Parasitic capacitors existing between the sensing node FD and adjacent conductive material include a parasitic capacitor $C_{OFD}$ between the sensing node FD and an output terminal, a parasitic capacitor $C_{123}$ between the sensing node FD and a select gate, a parasitic capacitor $C_{122}$ between the sensing node FD and a reset gate, a parasitic capacitor $C_{121}$ between the sensing node FD and a first transfer gate, a parasitic capacitor $C_{124}$ between the sensing node FD and a second transfer gate, a parasitic capacitor $C_{125}$ between the sensing node FD and a third transfer gate, and a parasitic capacitor $C_{126}$ between the sensing node FD and a fourth transfer gate.

Figure 13:
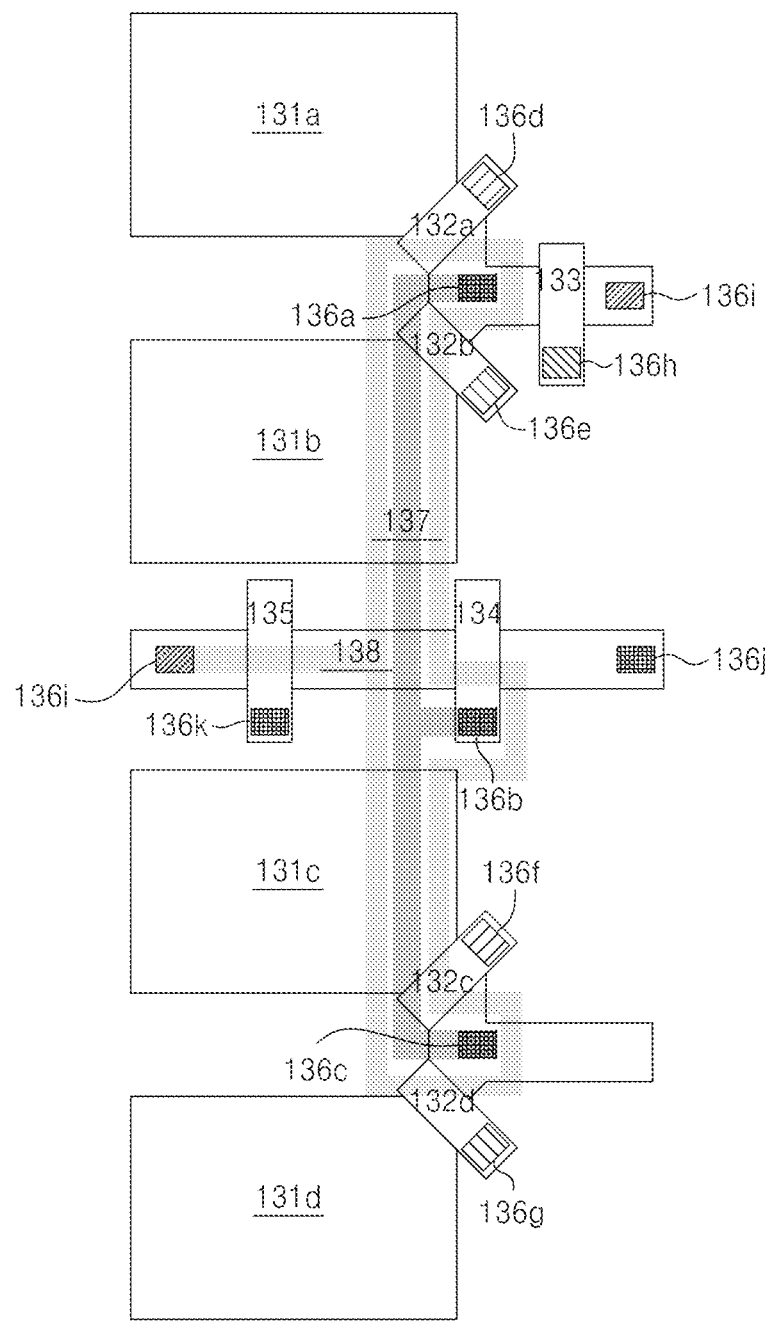
FIG. 13 is a plan view of the pixels illustrated in FIG. 12 according to an example embodiment.

FIG. 13 is a plan view of the pixels illustrated in FIG. 12 according to an example embodiment.

Referring to FIG. 13, four photodiodes 131a through 131d and four transfer gates 132a through 132d are provided. Since a single reset gate 133, a single sensing node 137, a single drive gate 134, and a single select gate 135 are provided, they are shared by the four pixels. The sensing node 137 is formed using a metal contact 136a, which is connected to source terminals between the two transfer gates 132a and 132b in common, a metal contact 136c, which is connected to source terminals between the two transfer gates 132c and 132d in common, and a metal contact 136b of the drive gate 134. An output line 138 is connected to a metal contact 136i connected to a source terminal of a select transistor and extended therefrom to surround the sensing node 137.

In a shared pixel structure illustrated in FIG. 13, the sensing node 137 and the output line 138 are disposed to overlap with the photodiodes 131b and 131c. Since the structure may cause a side effect of hindering incident light from entering the photodiodes 131b and 131c, the shared structure illustrated in FIG. 13 will be appropriate to a BIS.

When the structure is applied to a front side illumination sensor, it is necessary to change a part of the layout so that the sensing node 137 and the output line 138 do not overlap with the photodiodes 131b and 131c.

Figure 14:
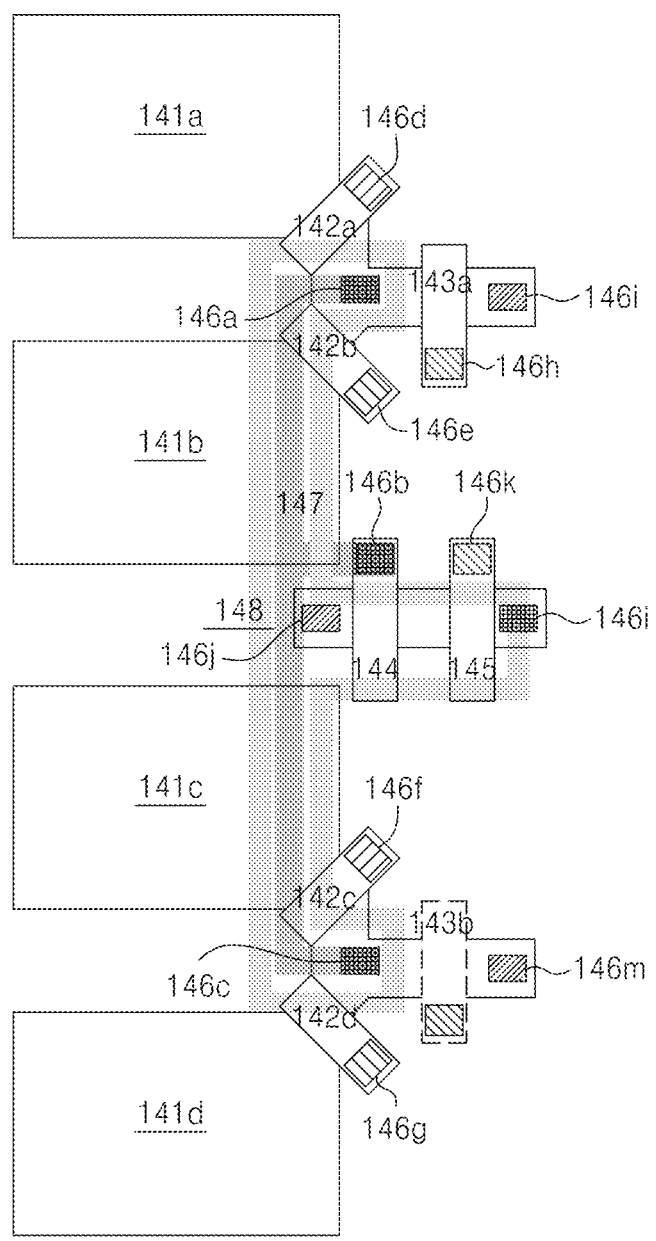
FIG. 14 is a plan view of the pixels illustrated in FIG. 12 according to an example embodiment.

FIG. 14 is a plan view of the pixels illustrated in FIG. 12 according to an example embodiment. Unlike the structure illustrated in FIG. 13 in which an active region for forming a source/drain terminal is positioned between pixels, the active region is positioned at one side of the pixels in the structure illustrated in FIG. 14.

In detail, four photodiodes 141a through 141d and four transfer gates 142a through 142d are provided. Since a single reset gate 143a, a single sensing node 147, a single drive gate 144, and a single select gate 145 are provided, they are shared by the four pixels. The sensing node 147 is formed using a metal contact 146a which is connected to source terminals between the two transfer gates 142a and 142b in common, a metal contact 146c, which is connected to source terminals between the two transfer gates 142c and 142d in common, and a metal contact 146b of the drive gate 144. An output line 148 is connected to a metal contact 146j connected to a source terminal of a select transistor and extended therefrom to surround the sensing node 147.

An active region in which a metal contact 146m is formed may actually be unnecessary, but it may be provided for pattern symmetry and simplification of a process of forming an initial active region. In addition, to control through a reset gate 143a for securing of a wide dynamic range or to prevent a reset level from going down due to the shared pixel structure, a dummy reset gate 143b and the metal contact 146m may be provided.

FIGS. 15A through 15D are detailed circuit diagrams of different examples of a unit pixel.

Figure 15A:
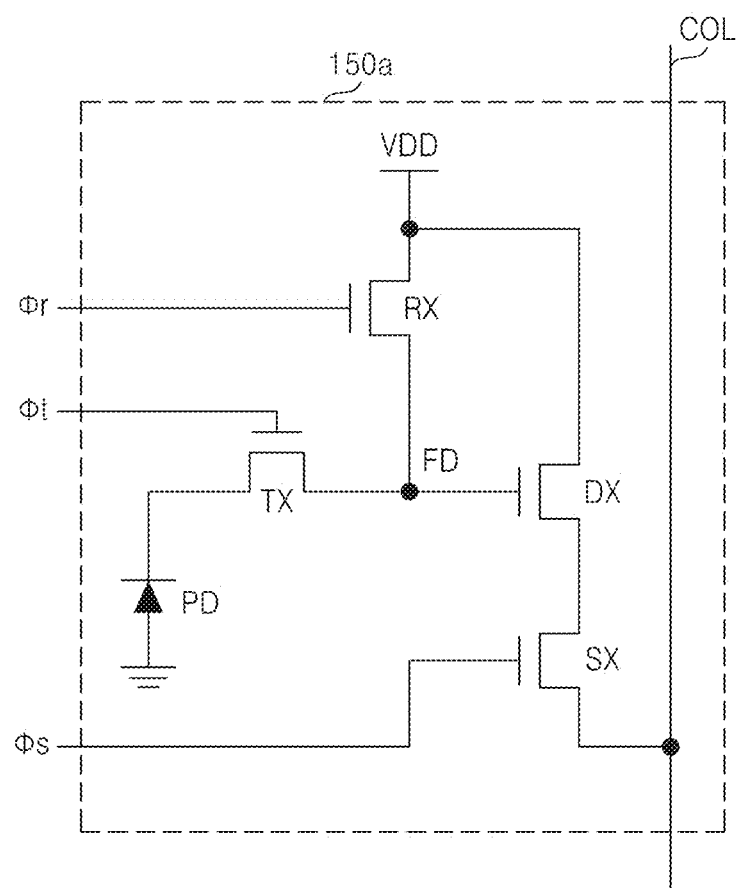
FIGS. 15A through 15D are detailed circuit diagrams of different examples of a unit pixel.

Referring to FIG. 15A, a unit pixel 150a includes a photodiode PD, a transfer transistor Tx, a sensing node FD, a reset transistor Rx, a drive transistor Dx, and a select transistor Sx.

The photodiode PD may include at least one among a photo transistor, a photo gate, a pinned photodiode (PPD), and a combination thereof.

FIG. 15A shows a 4-transistor (4T) structure that includes a single photodiode PD and four MOS transistors Tx, Rx, Dx, and Sx, but the inventive concepts are not restricted to this example. Any circuits including at least three transistors including the drive transistor Dx and the select transistor Sx and the photodiode PD may be used in the embodiments. The structure of FIG. 15A is the same as FIG. 3 with the reset and drive transistors Rx and Dx being connected to the same power supple voltage VDD, and the select transistor Sx supplying output to a column line COL.

Figure 15B:
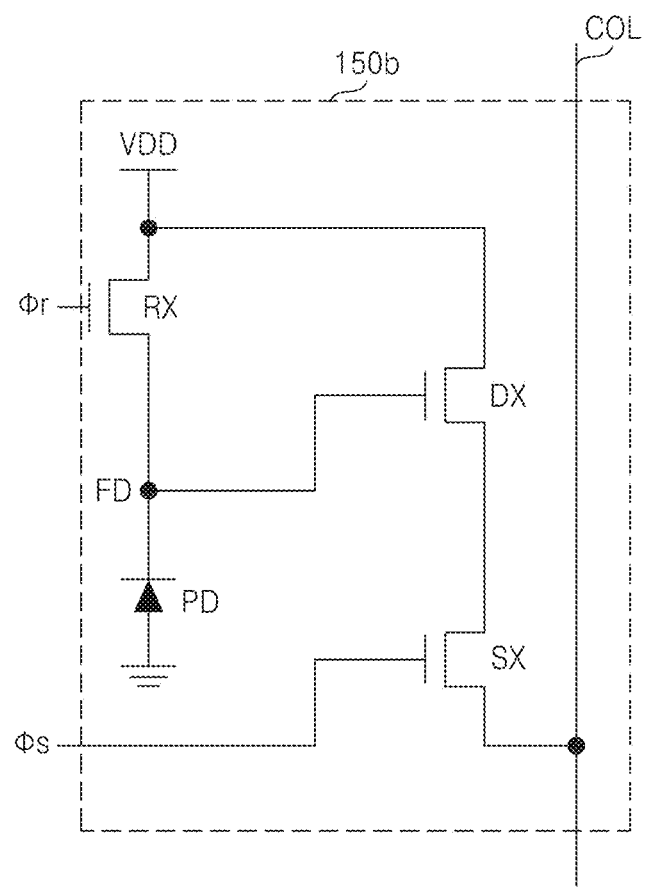

Referring to FIG. 15B, a unit pixel 150b has a 3-transistor (3T) structure that includes a photodiode PD, a reset transistor Rx, a drive transistor Dx, and a select transistor Sx. Namely, the structure is the same as FIG. 15B except that the transfer transistors Tx has been eliminated.

Figure 15C:
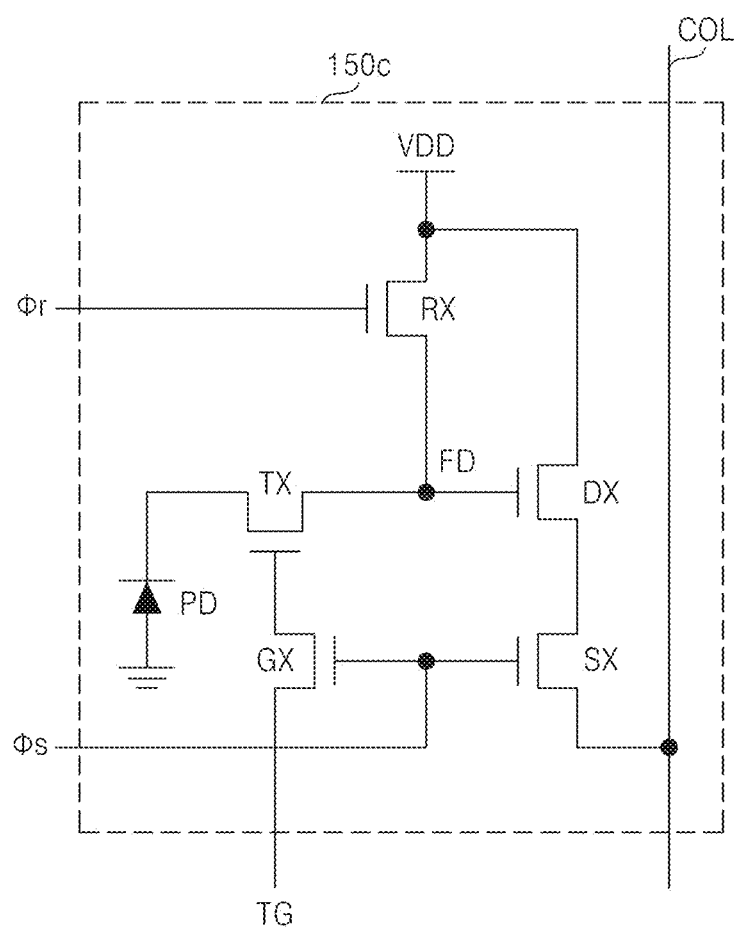

Referring to FIG. 15C, a unit pixel 150c has a 5-transistor (5T) structure that includes a photodiode PD, a transfer transistor Tx, a reset transistor Rx, a drive transistor Dx, a select transistor Sx, and one more transistor Gx. The embodiment of FIG. 15C is the same as the embodiment of FIG. 15A except that a transfer control transistor Gx selectively supplies a transfer gate signal TG to the transfer gate TX based on the gate control signal Φs.

Figure 15D:
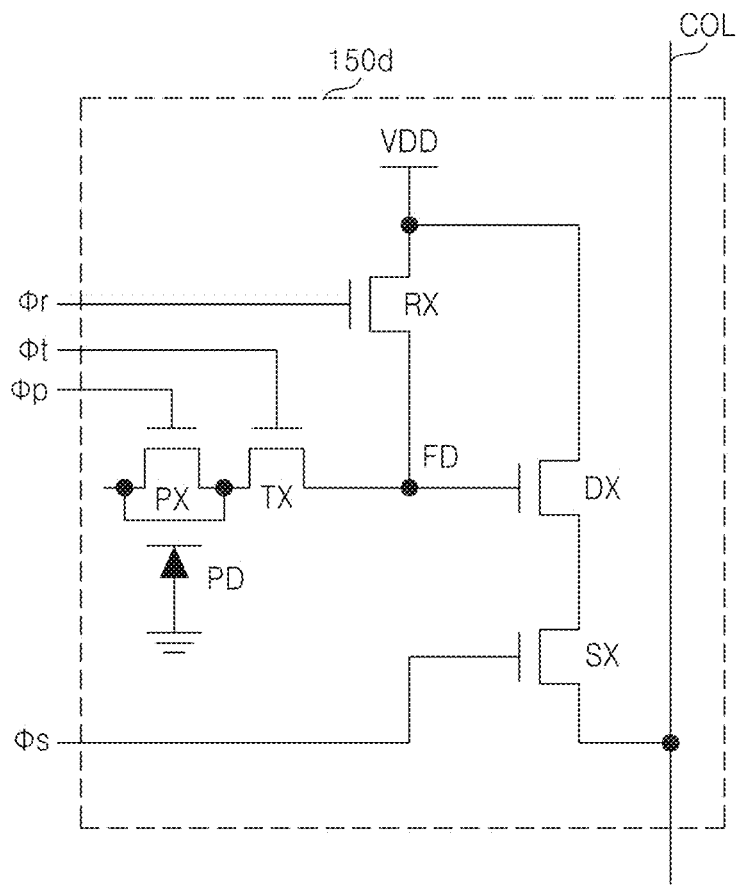

Referring to FIG. 15D, a unit pixel 150d has a 5T structure that includes a photodiode PD, a transfer transistor Tx, a reset transistor Rx, a drive transistor Dx, a select transistor Sx, and phototransistor Px. The embodiment of FIG. 15D is the same as the embodiment of FIG. 15A except that phototransistor Px is connected to the transfer transistor Tx. In this embodiment, an amount of charge transferred from the photodiode PD to the transfer transistor Tx depends on the gate control signal Φp applied to the gate of the phototransistor Px.

Figure 15E:
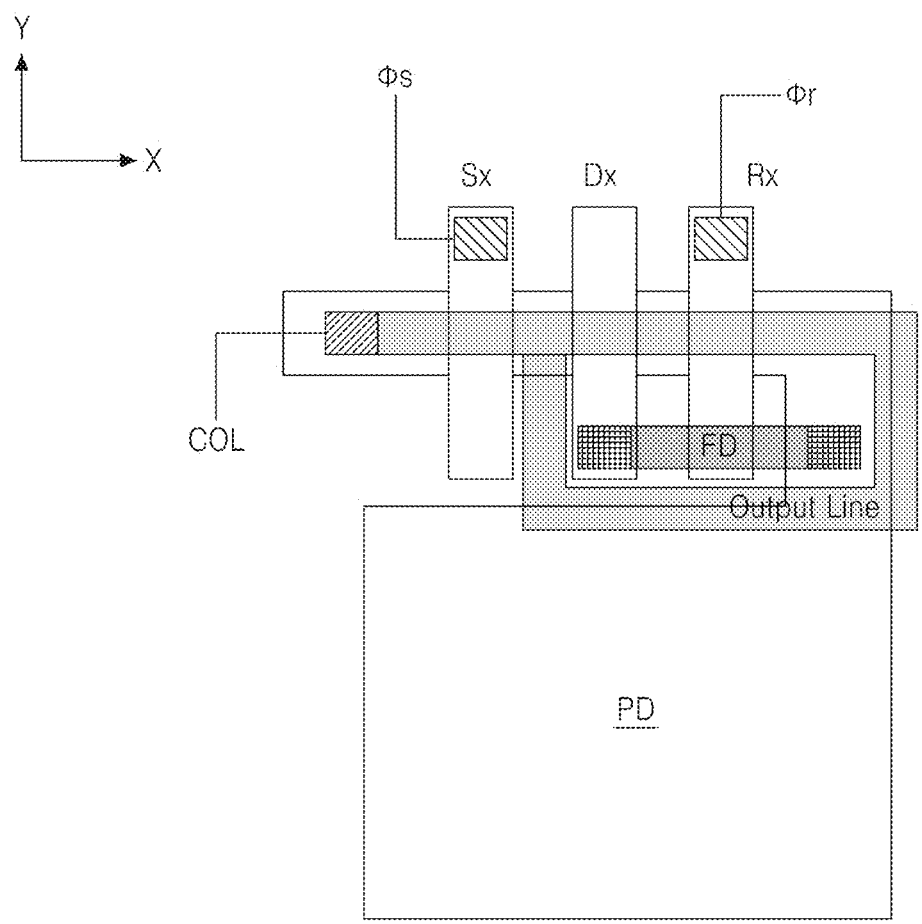
FIG. 15E is a plan view of the unit pixel shown in FIG. 15B.
Figure 15F:
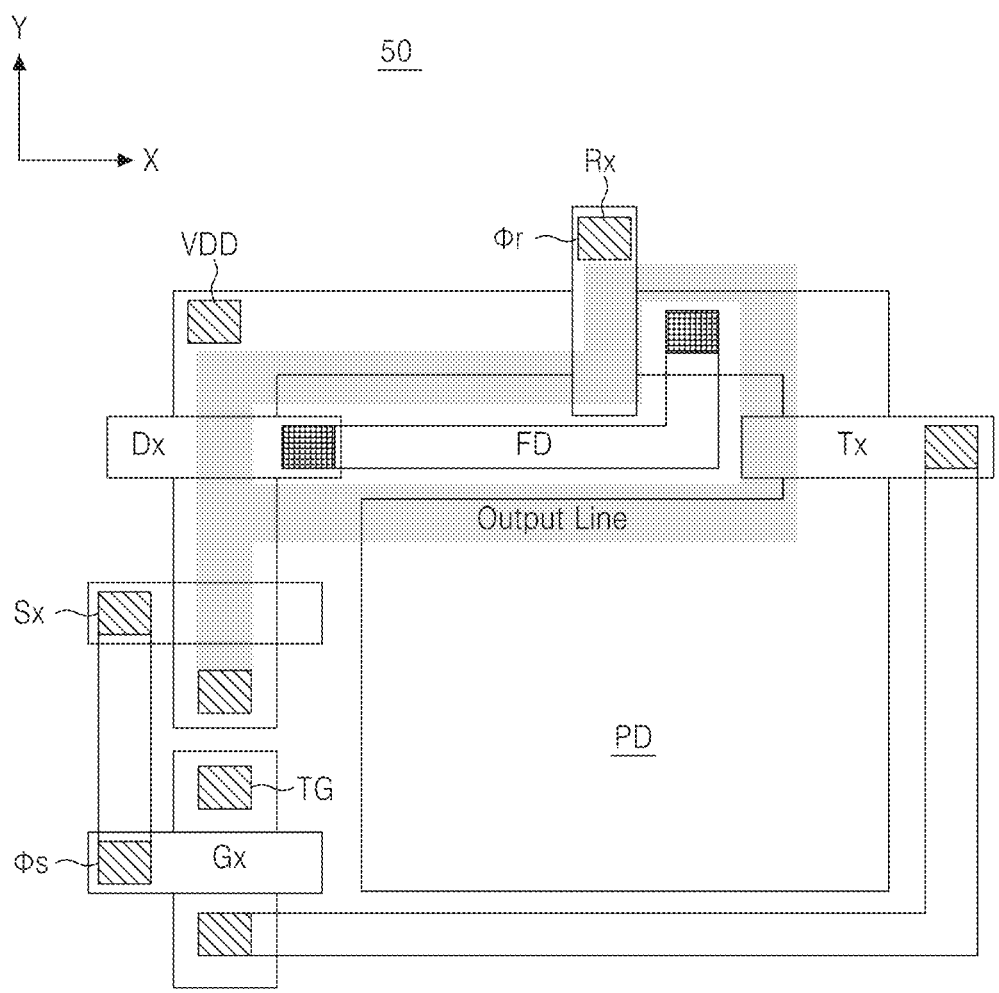
FIG. 15F is a plan view of the unit pixel shown in FIG. 15C.
Figure 16:
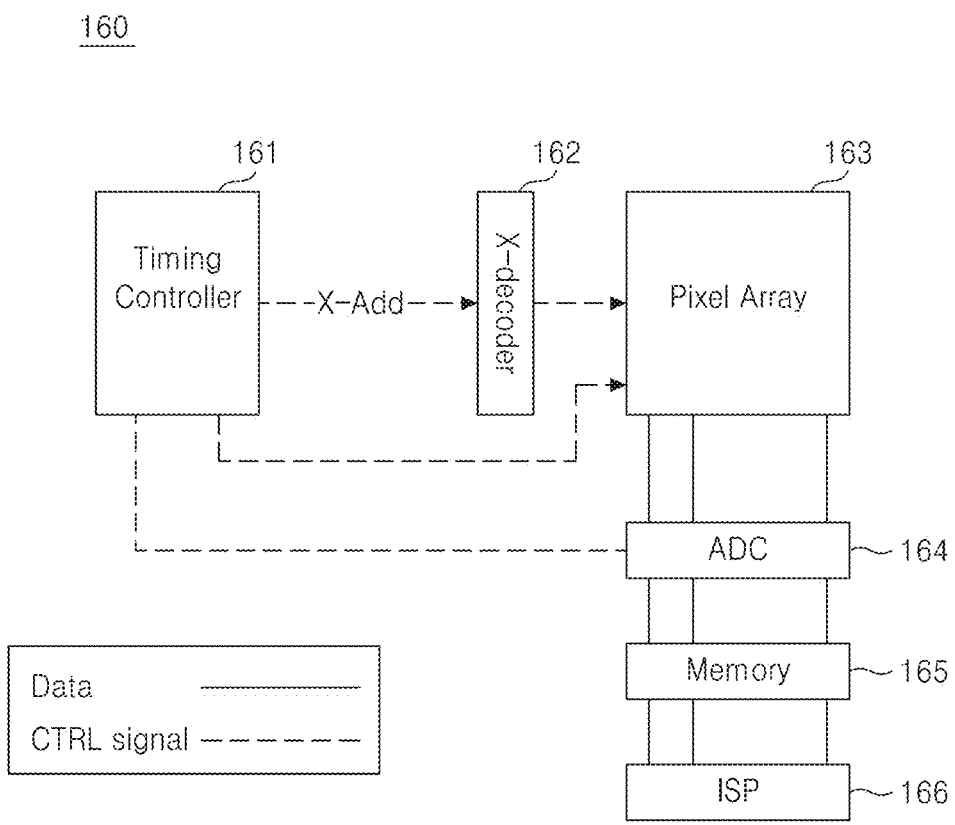
FIG. 16 is a diagram of an image sensor according to an example embodiment.

FIG. 15E is a plan view of the unit pixel shown in FIG. 15B.
FIG. 15F is a plan view of the unit pixel shown in FIG. 15C.
FIG. 16 is a diagram of an image sensor 160 according to an example embodiment.

Referring to FIG. 16, the image sensor 160 includes any one of the structures and the operations illustrated in FIGS. 1 through 15D. And thus the image sensor 160 has an improved conversion gain. The image sensor 160 converts an optical signal into an electrical signal and outputs the electrical signal. A timing controller 161 controls operation timing of the image sensor 160. For instance, the timing controller 161 may control a light collection time using a transfer gate control signal of the image sensor 160. The image sensor 160 includes a pixel array 163, an analog-to-digital converter (ADC) 164, an X-address decoder 162, a memory 165, and an image signal processor (ISP) 166.

The pixel array 163 includes an array of a plurality of pixels having any one of the structures illustrated in FIGS. 1A through 15D. The ADC 164 converts an analog signal output from the pixel array 163 into a digital signal. The memory 165 may be referred to as a buffer memory or a frame memory. The memory 165 may store the digital signal in units of frames. The ISP 166 performs necessary signal processing using an image signal stored in a digital form in the memory 165. The signal processing may include color interpolation, color correction, auto white balance, gamma correction, color saturation correction, formatting, bad pixel correction, and hue correction.

The X-address decoder 162 controls operation (or output) timing for each of the rows in the pixel array 163 using address information X-Add received from the timing controller 161.

The ADC 164 may have a different structure depending on a correlated double sampling (CDS) scheme, i.e. analog CDS, digital CDS, or dual CDS. The ADC 164 may be implemented as a column ADC provided for each of the columns in the image sensor 160 or a single ADC provided for all of the columns.

Figure 17:
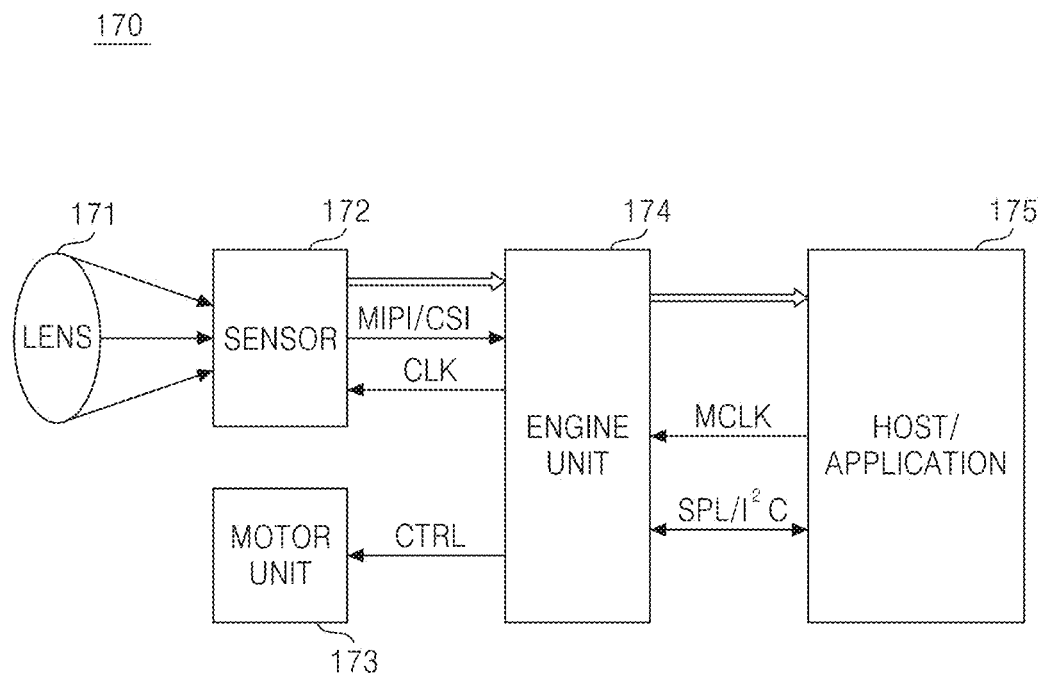
FIG. 17 is a block diagram of a camera system according to an example embodiment.

FIG. 17 is a block diagram of a camera system 170 according to an example embodiment. The camera system 170 may be a digital camera.

Referring to FIG. 17, the camera system 170 may include a lens 171, an image sensor 172, a monitor unit 173, and an engine unit 174. The pixel structure of the image sensor 172 may include any one of the layouts of an output line illustrated in FIGS. 1A through 15D.

The lens 171 focuses incident light onto a light receiving area (e.g., a photodiode) in the image sensor 172. The image sensor 172 generates image data based on the incident light received through the lens 171. The image sensor 172 provides the image data based on a clock signal CLK. The image sensor 172 may interface with the engine unit 174 using a mobile industry processor interface (MIPI) and/or a camera serial interface (CSI). The motor unit 173 may adjust the focus of the lens 171 in response to a control signal CTRL received from the engine unit 174 or perform shuttering. The engine unit 174 controls the image sensor 172 and the motor unit 173. The engine unit 174 may generate YUV data including a distance to an object, a luminance component, a difference between the luminance component and a blue component, and a difference between the luminance component and a red component based on distance and/or image data received from the image sensor 172 or generate compressed data, e.g., Joint Photography Experts Group (JPEG) data. The engine unit 174 may be connected to a host/application 175 and may provide the YUV data or JPEG data to the host/application 175 based on a master clock signal MCLK. In addition, the engine unit 174 may interface with the host/application 175 using a serial peripheral interface (SPI) and/or an inter integrated circuit (I²C).

Figure 18:
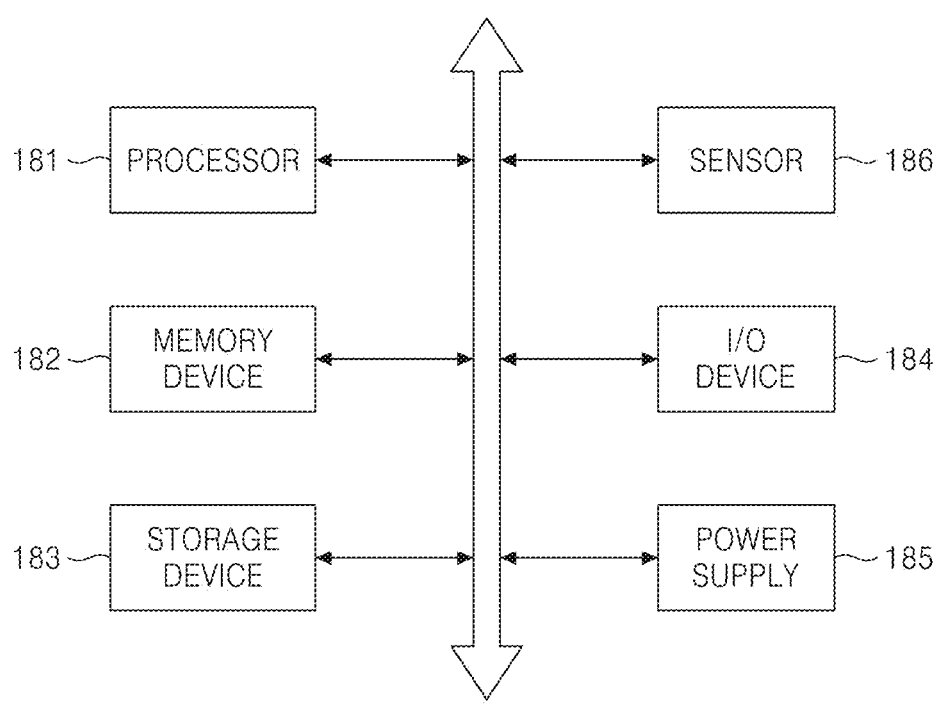
FIG. 18 is a block diagram of a computing system according to an example embodiment.

FIG. 18 is a block diagram of a computing system 180 according to an example embodiment. Referring to FIG. 18, the computing system 180 may include a processor 181, a memory device 182, a storage device 183, an input/output (I/O) device 184, a power supply 185, and an image sensor 186. The pixel structure of the image sensor 186 may include any one of the layouts of an output line illustrated in FIGS. 1A through 15D.

Although not shown in FIG. 18, the computing system 180 may also include ports that can communicate with video cards, sound cards, memory cards, universal serial bus (USB) devices, or other electronic devices.

The processor 181 may perform particular calculations or tasks. The processor 181 may be a microprocessor or a central processing unit (CPU). The processor 181 may communicate with the memory device 182, the storage device 183, and the I/O device 184 through an address bus, a control bus, and a data bus. The processor 181 may also be connected to an extended bus such as a peripheral component interconnect (PCI) bus. The memory device 182 may store data necessary for the operations of the computing system 180. The memory device 182 may be implemented by dynamic random access memory (DRAM), mobile DRAM, static RAM (SRAM), phase-change RAM (PRAM), ferroelectric RAM (FRAM), resistive RAM (RRAM) and/or magnetoresistive RAM (MRAM).

The storage device 183 may include a solid state drive (SSD), a hard disk drive (HDD), and a compact disk-read only memory (CD-ROM). The I/O device 184 may include an input device such as a keyboard, a keypad, and a mouse and an output device such as a printer and a display. The power supply 185 may provide an operating voltage necessary for the operation of the computing system 180.

The image sensor 186 may communicate with the processor 181 through buses or other communication links. The image sensor 186 and the processor 181 may be integrated together into a single chip or may be separately integrated into different chips, respectively. The computing system 180 may be any type of computing system using the image sensor 186. For instance, the computing system 180 may be a digital camera, a cellular phone, a personal digital assistant (PDA), a portable multimedia player (PMP), or a smart phone.

Figure 19:
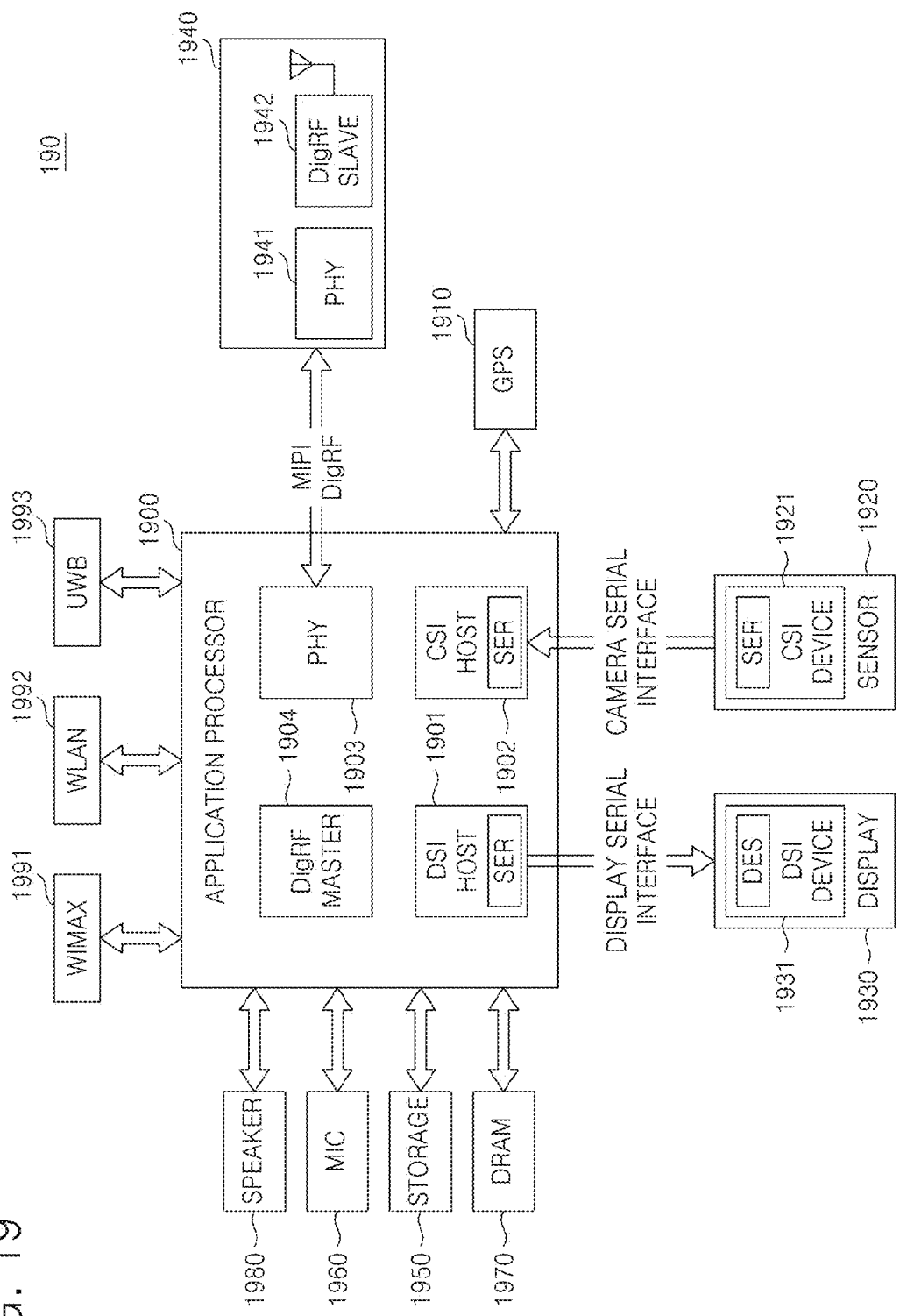
FIG. 19 is a block diagram of an example of an interface used in the computing system illustrated in FIG. 18.

FIG. 19 is a block diagram of an example of an interface used in a computing system 190 according to an example embodiment.

Referring to FIG. 19, the computing system 190 may be implemented as a data processing device which can use or support MIPI and may include an application processor 1900, an image sensor 1920, and a display 1930. A CSI host 1902 included in the application processor 1900 may perform serial communication with a CSI device 1921 included in the image sensor 1920 using CSI. The CSI host 1902 may include a deserializer DES and the CSI device 1921 may include a serializer SER. The pixel structure of the image sensor 1920 may include any one of the layouts of an output line illustrated in FIGS. 1 through 15D.

A display serial interface (DSI) host 1901 included in the application processor 1900 may perform serial communication with a DSI device 1931 included in the display 1930 using DSI. The DSI host 1901 may include a serializer SER and the DSI device 1931 may include a deserializer DES. The computing system 190 may also include a radio frequency (RF) chip 1940 which can communicate with the application processor 1900. A physical layer (PHY) 1903 of the application processor 1900 and a PHY 1941 of the RF chip 1940 may communicate data with each other according to MIPI DigRF. The application processor 1900 may also include a DigRF master 1904 which controls the PHY 1903 to transmit and receive data according to the MIPI DigRF.

The computing system 190 may further include a global positioning system (GPS) 1910, a storage 1950, a microphone (MIC) 1960, a DRAM 1970, and a speaker 1980. The computing system 190 may communicate using an ultra-wideband (UWB) 1993, a wireless local area network (WLAN) 1992, and a worldwide interoperability for microwave access (WIMAX) 1991. The structure and the interface of the computing system 190 illustrated in FIG. 19 is just an example, and the present invention is not restricted thereto.

According to some embodiments, the conversion gain of a CMOS image sensor is increased, and therefore, the sensitivity of the CMOS image sensor is also increased.

While the embodiments have been particularly shown and described, it will be understood by those of ordinary skill in the art that various changes in forms and details may be made therein without departing from the spirit and scope of the inventive concepts as defined by the following claims.

What is claimed is:

1. An image sensor comprising:
   a first photodiode configured to convert an optical signal into a photocharge;
   a sensing node configured to store the photocharge of the first photodiode;
   a circuit configured to selectively output an electrical signal corresponding to the photocharge at the sensing node on an output line, and the circuit connected to at least a first conductive contact; and
   the output line is between the sensing node and the first conductive contact, the output line surrounding at least one of the sensing node and the first conductive contact such that the output line is configured to shield the sensing node from the first conductive contact.

2. The image sensor of claim 1, wherein
   the circuit includes a transfer transistor configured to transfer the photocharge to the sensing node, the transfer transistor connected to the first conductive contact; and
   the output line is between the sensing node and the first conductive contact.

3. The image sensor of claim 2, wherein the transfer transistor has a gate connected to the first conductive contact for receiving a gate control signal.

4. The image sensor of claim 2, wherein
   the circuit includes a reset transistor configured to reset a voltage level of the sensing node, and the reset transistor is connected to a second conductive contact; and
   the output line is between the sensing node and the second conductive contact.

5. The image sensor of claim 4, wherein
the circuit includes a drive transistor configured to convert the photocharge into the electrical signal.

6. The image sensor of claim 5, wherein
the circuit includes a select transistor configured to control transfer of the electrical signal to the output line, and the select transistor is connected to a third conductive contact; and
the output line is between the sensing node and the third conductive contact.

7. The image sensor of claim 6, wherein the output line surrounds the sensing node.

8. The image sensor of claim 7, wherein the output line is in a same plane as the sensing node.

9. The image sensor of claim 6, wherein the output line further surrounds the third conductive contact.

10. The image sensor of claim 9, wherein the output line is in a same plane as the sensing node.

11. The image sensor of claim 5, wherein
the drive transistor is connected to a voltage supply, and has a drive gate connected to the sensing node.

12. The image sensor of claim 11, wherein
the circuit includes a select transistor configured to control transfer of the electrical signal to the output line, and the select transistor is connected between the output line and the drive transistor, and has a select gate connected to a third conductive contact; and
the output line is between the sensing node and the third conductive contact.

13. The image sensor of claim 5, wherein
the drive transistor is connected to the output line, and has a drive gate connected to the sensing node.

14. The image sensor of claim 13, wherein the circuit includes a select transistor configured to control transfer of the electrical signal to the output line, and the select transistor is connected between a voltage supply and the drive transistor, and has a select gate connected to a third conductive contact; and
the output line is between the sensing node and the third conductive contact.

15. The image sensor of claim 5, wherein
the reset transistor is connected between a voltage supply contact and the sensing node, and has a reset gate connected to the second conductive contact.

16. The image sensor of claim 15, wherein
the circuit includes a select transistor configured to control transfer of the electrical signal to the output line, and the select transistor is connected between the voltage supply contact and the drive transistor, and has a select gate connected to a third conductive contact; and
the output line is between the sensing node and the third conductive contact.

17. The image sensor of claim 5, wherein the transfer transistor has a gate connected to the first conductive contact for receiving a first gate control signal, the reset transistor has a gate connected to the second conductive contact for receiving a second gate control signal, and a select transistor has a gate connected to the third conductive contact for receiving a third gate control signal.

18. The image sensor of claim 1, wherein
the circuit includes a reset transistor configured to reset a voltage level of the sensing node, and the reset transistor is connected to the first conductive contact; and
the output line is between the sensing node and the first conductive contact.

19. The image sensor of claim 18, wherein the reset transistor has a gate connected to the first conductive contact for receiving a gate control signal.

20. The image sensor of claim 18, wherein
the circuit includes a drive transistor configured to convert the photocharge into the electrical signal.

21. The image sensor of claim 20, wherein
the circuit includes a select transistor configured to control transfer of the electrical signal to the output line, and the select transistor is connected to a second conductive contact; and
the output line is between the sensing node and the second conductive contact.

22. The image sensor of claim 18, wherein
the circuit includes a transfer transistor configured to transfer the photocharge to the sensing node; and
a control transistor configured to control operation of the transfer transistor, and the control transistor is connected to a second conductive contact.

23. The image sensor of claim 22, wherein
the control transistor has a gate connected to the second conductive contact.

24. The image sensor of claim 1, wherein
the circuit includes a drive transistor configured to convert the photocharge into the electrical signal;
the circuit includes a select transistor configured to control transfer of the electrical signal to the output line, and the select transistor is connected to the first conductive contact; and
the output line is between the sensing node and the first conductive contact.

25. The image sensor of claim 24, wherein the output line surrounds the first conductive contact.

26. The image sensor of claim 24, wherein the select transistor has a gate connected to the first conductive contact for receiving a gate control signal.

27. The image sensor claim 1, wherein the output line and the sensing node are in a same plane.

28. The image sensor of claim 1, wherein the circuit is configured to receive a control signal via a conductive contact.

29. The image sensor of claim 1, further comprising:
a second photodiode configured to convert the optical signal into the photocharge; and wherein
the sensing node is configured to store the photocharge of the second photodiode.

30. The image sensor of claim 29, wherein the circuit comprises:
a first transfer transistor configured to transfer the photocharge of the first photodiode to the sensing node, the first transfer transistor connected to the first conductive contact;
a second transfer transistor configured to transfer the photocharge of the second photodiode to the sensing node, the second transfer transistor connected to a second conductive contact;
a reset transistor configured to reset a voltage level of the sensing node, the reset transistor connected to a third conductive contact; and
a drive transistor configured to convert the photocharge at the sensing node into the electrical signal; and wherein
the output line is between the sensing node and at least one of the first through third conductive contacts.

31. The image sensor of claim 30, wherein the output line is between the sensing node and each of the first through third conductive contacts.

32. The image sensor of claim 30, wherein the circuit further comprises:
- a select transistor configured to control transfer of the electrical signal to the output line, the select transistor is connected to a fourth conductive contact; and
- the output line is between the sensing node and at least one of the first through fourth conductive contacts.

33. The image sensor of claim 1, further comprising:
- a second photodiode configured to convert the optical signal into the photocharge;
- a third photodiode configured to convert the optical signal into the photocharge;
- a fourth photodiode configured to convert the optical signal into the photocharge; and wherein
- the sensing node is configured to store the photocharges of the first through fourth photodiodes.

34. The image sensor of claim 33, wherein the circuit comprises:
- a first transfer transistor configured to transfer the photocharge of the first photodiode to the sensing node, the first transfer transistor connected to the first conductive contact;
- a second transfer transistor configured to transfer the photocharge of the second photodiode to the sensing node, the second transfer transistor connected to a second conductive contact;
- a third transfer transistor configured to transfer the photocharge of the third photodiode to the sensing node, the third transfer transistor connected to a third conductive contact;
- a fourth transfer transistor configured to transfer the photocharge of the fourth photodiode to the sensing node, the fourth transfer transistor connected to a fourth conductive contact;
- a reset transistor configured to reset a voltage level of the sensing node, the reset transistor connected to a fifth conductive contact; and
- a drive transistor configured to convert the photocharge at the sensing node into the electrical signal; and wherein the output line is between the sensing node and at least one of the first through fifth conductive contacts.

35. The image sensor of claim 34, wherein the output line is between the sensing node and each of the first through fifth conductive contacts.

36. The image sensor of claim 34, wherein the circuit further comprises:
- a select transistor configured to control transfer of the electrical signal to the output line, the select transistor is connected to a sixth conductive contact; and
- the output line is between the sensing node and at least one of the first through sixth conductive contacts.

37. An image sensor comprising:
- a photodiode configured to convert an optical signal into a photocharge;
- a sensing node configured to store the photocharge;
- a circuit configured to selectively output an electrical signal corresponding to the photocharge at the sensing node on an output line; and
- the output line is between the sensing node and at least one conductive contact, the output line surrounding at least one of the sensing node and the at least one conductive contact such that the output line is configured to shield the sensing node from the at least one conductive contact.

38. An image sensor comprising:
- a first photodiode configured to convert an optical signal into a photocharge;
- a sensing node configured to store the photocharge of the first photodiode;
- a circuit configured to selectively output an electrical signal corresponding to the photocharge at the sensing node on an output line; and
- the output line is between the sensing node and at least one conductive contact, the output line surrounding at least one of the sensing node and the at least one conductive contact such that the output line is configured to shield the sensing node from the at least one conductive contact.

* * * * *